(12) United States Patent
Kim

(10) Patent No.: US 12,327,516 B2
(45) Date of Patent: Jun. 10, 2025

(54) LIGHT EMITTING DIODE DISPLAY DEVICE AND METHOD OF DRIVING THE SAME

(71) Applicant: YAS CO. LTD., Gyeonggi-do (KR)

(72) Inventor: Bum Sik Kim, Gyeonggi-do (KR)

(73) Assignee: YAS CO. LTD., Gyeonggi-Do (KR)

( * ) Notice: Subject to any disclaimer, the term of this patent is extended or adjusted under 35 U.S.C. 154(b) by 0 days.

(21) Appl. No.: 18/578,158

(22) PCT Filed: Jun. 28, 2022

(86) PCT No.: PCT/KR2022/009174
§ 371 (c)(1),
(2) Date: Jan. 10, 2024

(87) PCT Pub. No.: WO2023/287065
PCT Pub. Date: Jan. 19, 2023

(65) Prior Publication Data
US 2024/0321182 A1    Sep. 26, 2024

(30) Foreign Application Priority Data

Jul. 13, 2021 (KR) .................. 10-2021-0091332
Jun. 22, 2022 (KR) .................. 10-2022-0076210

(51) Int. Cl.
*G09G 3/32* (2016.01)
*H01L 25/16* (2023.01)

(52) U.S. Cl.
CPC ....... *G09G 3/32* (2013.01); *G09G 2310/0289* (2013.01); *G09G 2320/0233* (2013.01); *H01L 25/167* (2013.01)

(58) Field of Classification Search
CPC ............ G09G 3/32; G09G 2310/0289; G09G 2320/0233; G09G 2300/0842; G09G 2300/0861; G09G 2310/027; G09G 2330/021; G09G 3/3225; G09G 3/3283; H01L 25/167
See application file for complete search history.

(56) References Cited

U.S. PATENT DOCUMENTS 10,269,308 B2 * 4/2019 Yang ............... G09G 3/3607
10,466,553 B2 * 11/2019 Irie .................. G02F 1/134336
(Continued)

FOREIGN PATENT DOCUMENTS

JP     2011-158821    8/2011
KR   10-2008-0079364  9/2008
(Continued)

OTHER PUBLICATIONS

Office Action dated Jan. 7, 2025 for corresponding Japanese Patent Application No. 2024-502084.
(Continued)

*Primary Examiner* — Benyam Ketema
(74) *Attorney, Agent, or Firm* — Duane Morris LLP

(57) ABSTRACT

A light emitting diode display device includes: a display panel having a plurality of pixels; a light emitting diode in each of the plurality of pixels; at least one current source connected between the light emitting diode and an emission high level voltage or between the light emitting diode and an emission low level voltage; and a control circuit part supplying a control signal to the at least one current source.

16 Claims, 15 Drawing Sheets

(56) References Cited

U.S. PATENT DOCUMENTS

| | | | |
|---|---|---|---|
| 11,881,182 B1* | 1/2024 | Guo | H05B 45/345 |
| 2002/0021293 A1 | 2/2002 | Tam | |
| 2002/0195968 A1* | 12/2002 | Sanford | G09G 3/325 |
| | | | 315/169.3 |
| 2003/0020413 A1* | 1/2003 | Oomura | G09G 3/3241 |
| | | | 315/169.3 |
| 2003/0107560 A1* | 6/2003 | Yumoto | G09G 3/30 |
| | | | 345/204 |
| 2004/0066358 A1* | 4/2004 | Numao | G09G 3/3291 |
| | | | 345/76 |
| 2006/0232183 A1* | 10/2006 | Park | G09G 3/3291 |
| | | | 313/483 |
| 2007/0182885 A1* | 8/2007 | Egi | H10K 50/86 |
| | | | 349/96 |
| 2010/0277400 A1* | 11/2010 | Jeong | G09G 3/3275 |
| | | | 345/76 |
| 2011/0122119 A1* | 5/2011 | Bae | G09G 3/3233 |
| | | | 345/211 |
| 2013/0135272 A1* | 5/2013 | Park | G09G 3/3233 |
| | | | 345/211 |
| 2015/0243215 A1* | 8/2015 | Kim | G09G 3/3233 |
| | | | 345/77 |
| 2016/0314741 A1 | 10/2016 | Yin | |
| 2016/0351132 A1* | 12/2016 | Joo | H05B 45/38 |

FOREIGN PATENT DOCUMENTS

| | | |
|---|---|---|
| KR | 10-2011-0057534 | 6/2011 |
| KR | 10-2015-0100982 | 9/2015 |
| KR | 10-2016-0072830 | 6/2016 |
| KR | 10-2016-0141456 | 12/2016 |

OTHER PUBLICATIONS

International Search Report Issued Oct. 27, 2022 For Corresponding PCT Application PCT/KR2022/009174.

* cited by examiner

LIGHT EMITTING DIODE DISPLAY DEVICE AND METHOD OF DRIVING THE SAME

CROSS REFERENCE TO RELATED APPLICATIONS

This application is a continuation of International Application No. PCT/KR2022/009174, filed on Jun. 28, 2022, which claims the benefit of priority from Korean Application No. 10-2021-0091332, filed on Jul. 13, 2021 and No. 10-2022-0076210, filed on June 22, in the Korean Intellectual Property Office, the entire disclosures of each of which are incorporated herein by reference for all purposes.

FIELD

The present invention relates to a light emitting diode display device, and more particularly, to a light emitting diode display device including a pixel having a negative (N) type transistor and a positive (P) type transistor and a method of driving the light emitting diode display device.

DISCUSSION OF THE RELATED ART

A fabrication cost of an organic light emitting diode display device or a micro light emitting diode display device may be reduced by forming a pixel with one kind of transistors among a negative (N) type transistor and a positive (P) type transistor. However, there is a problem such that a property change or a limitation on an operation due to a change of a source voltage occurs.

FIG. 1 is a view showing a pixel of an organic light emitting diode display device according to a first example of the related art, and FIG. 2 is a view showing signals of an organic light emitting diode display device according to a first example of a related art.

In FIG. 1, a pixel P of an organic light emitting diode (OLED) display device according to a first example of the related art includes first to seventh transistors M1 to M7 of a P type, a first capacitor C1 and a light emitting diode Del.

The first transistor M1 switches a connection between a high level voltage EVDD, the first capacitor C1 and the second and fourth transistors M2 and M4 according to an emission signal EM, and the second transistor M2 switches a connection between a data signal DATA and the first and fourth transistors M1 and M4 according to an Nth gate signal GATE(N).

The third transistor M3 switches a connection between the first capacitor C1, the fourth and fifth transistors M4 and M5, an initialization voltage VINT and the seventh transistor M7 according to an (N−1)th gate signal GATE(N−1), and the fourth transistor M7 switches a connection between the first and second transistors M1 and M2 and the fifth and sixth transistors M5 and M6 according to a voltage of a connection node of the first capacitor C1 and the third and fifth transistors M3 and M5.

The fifth transistor M5 switches a connection between the first transistor C1, the third and fourth transistors M3 and M4 and the fourth and sixth transistors M4 and M6 according to the Nth gate signal GATE(N), and the sixth transistor M6 switches a connection between the fourth and fifth transistors M4 and M5 and the light emitting diode Del according to the emission signal EM.

The seventh transistor M7 switches a connection between the initialization voltage VINT, the third transistor and the light emitting diode Del according to the Nth gate signal GATE(N).

A first electrode of the first capacitor C1 is connected to the high level voltage EVDD and the first transistor M1, and a second electrode of the first capacitor C1 is connected to the third, fourth and fifth transistors M3, M4 and M5.

An anode of the light emitting diode Del is connected to the sixth and seventh transistors M6 and M7, and a cathode of the light emitting diode Del is connected to a low level voltage EVSS.

In FIG. 2, the data signal DATA has a valid period in each frame, and the (N−1)th gate signal GATE(N−1) has a low level during an initialization period Tin corresponding to the valid period of a previous frame of the data signal DATA. The Nth gate signal GATE(N) has a low level during a sensing and programming period Tsp corresponding to the valid period of a present frame of the data signal DATA, and the emission signal EM has a low level during an emission period Tem corresponding to a period after the valid period of a next frame of the data signal DATA.

As a result, during the initialization period Tin, the third transistor M3 is turned on such that the first capacitor C1 is charged up with the initialization voltage VINT.

During the sensing and programming period Tsp, the second transistor M2 is turned on such that the data signal DATA is applied to a source of the fourth transistor M4, the fifth transistor M5 is turned on such that the first capacitor C1 is charged up with the data signal DATA and a threshold voltage of the fourth transistor M4, and the seventh transistor M7 is turned on such that the initialization voltage VINT is applied to the light emitting diode Del.

During the emission period Tem, the first transistor M1 is turned on such that the high level voltage EVDD is applied to the source of the fourth transistor M4, and the sixth transistor M6 is turned on such that a current corresponding to the data signal DATA is supplied to the light emitting diode Del and the light emitting diode Del emits a light corresponding to the data signal DATA.

Since the pixel P operates using the high level voltage EVDD as a reference, a current flowing through the fourth transistor M4 of a driving transistor may be changed when the high level voltage EVDD supplied to each pixel P of the display panel is changed. As a result, a luminance of a light emitted from each pixel P may be changed and a total luminance property may be changed according to an average luminance or an image type of the display panel.

The non-uniformity of an emission luminance of one display panel may not be recognized by a user. However, when two or more display panels are connected to each other to constitute one large-sized display system such as a tiled display device, a luminance difference between the display panels may be recognized as an planar stain by a user.

FIG. 3 is a view showing a pixel of an organic light emitting diode display device according to a second example of the related art.

In FIG. 3, a pixel P of an organic light emitting diode (OLED) display device according to a second example of the related art includes first to third transistors M1 to M3 of an N type, a first capacitor C1 and a light emitting diode Del.

A gate of the first transistor M1, a source of the second transistor M2 and a first electrode of the first capacitor C1 are connected to each other to constitute a first node N1, and a source of the first transistor M1, a source of the third transistor M3, a second electrode of the first capacitor C1 and an anode of the light emitting diode Del are connected to each other to constitute a second node N2.

The first transistor M1 switches a connection between a high level voltage EVDD and the second node N2 according to a voltage of the first node N1, and the second transistor M2 switches a connection between a data signal DATA and the first node N1 according to a gate signal GATE.

The third transistor M3 switches a connection between a reference voltage VREF and the second node N2 according to a reference signal REF.

A first electrode of the first capacitor C1 is connected to the first node N1, and a second electrode of the first capacitor C1 is connected to the second node N2.

An anode of the light emitting diode Del is connected to the second node N2, and a cathode of the light emitting diode Del is connected to a low level voltage EVSS.

As a result, during a period where each of the gate signal GATE and the reference signal REF has a high level, the second transistor M2 is turned on such that the data signal DATA is applied to the first node N1, and the third transistor M3 is turned on such that the reference voltage VREF is applied to the second node N2 and the data signal DATA and the reference voltage VREF are applied to the first and second electrodes, respectively, of the first capacitor C1.

During a period where each of the gate signal GATE and the reference signal REF has a low level, each of the second and third transistors M2 and M3 is turned off such that a voltage of the first node N1 is boosted to correspond to a threshold voltage. Since a degree of boosting is changed according to the low level voltage EVSS, a non-uniformity of a luminance may occur.

When the low level voltage EVSS supplied to each pixel P of the display panel is changed, a current flowing through the first transistor M1 of a driving transistor may be changed. As a result, a luminance of a light emitted from each pixel P may be changed and a total luminance property may be changed according to an average luminance or an image type of the display panel.

The non-uniformity of an emission luminance of one display panel may not be recognized by a user. However, when two or more display panels are connected to each other to constitute one large-sized display system such as a tiled display device, a luminance difference between the display panels may be recognized as a planar stain by a user.

FIG. 4 is a view showing a large-sized display system according to the related art.

In FIG. 4, a large-sized display system according to the related art includes a plurality of light emitting diode display panels arranged in a 3*3 matrix shape including first to third panel rows PR1 to PR3 and first to third panel columns PC1 to PC3.

When a current of a driving transistor is changed due to a change of a high level voltage EVDD or a low level voltage EVSS, the non-uniformity of an emission luminance may not be recognized in one light emitting diode display panel. However, the non-uniformity of an emission luminance may be recognized as a planar stain in the plurality of light emitting diode display panels two-dimensionally tiled.

DETAILED ILLUSTRATION OF THE INVENTION

Technical Problem

The object of the present invention is to provide a light emitting diode display device and a method of driving the same where a uniform current is supplied to a light emitting diode even when a source voltage is changed and a uniformity of an emission luminance is improved by connecting a current source transistor and a source follower transistor to an anode and a cathode, respectively, of the light emitting diode.

In addition, the object of the present invention is to provide a light emitting diode display device and a method of driving the same where a capability of defect detection in a fabrication process is improved and a fabrication cost is reduced due to repair of a defect by connecting a test transistor to an anode and a cathode of a light emitting diode.

Technical Solution

To obtain the above object, the present invention provides a light emitting diode display device including: a display panel having a plurality of pixels; a light emitting diode in each of the plurality of pixels; at least one current source connected between the light emitting diode and an emission high level voltage or between the light emitting diode and an emission low level voltage; and a control circuit part supplying a control signal to the at least one current source.

Further, the at least one current source includes: a first transistor connected between the light emitting diode and the emission high level voltage and having one of a negative type and a positive type; and a second transistor connected between the light emitting diode and an emission low level voltage and having another of the negative type and the positive type.

In addition, the control circuit part includes: a latch connected between a digital high level voltage and a digital low level voltage and generating first and second output signals using an image data and a programming signal; and a level shifter connected between a pin high level voltage and a pin low level voltage and generating third and fourth output signals switching the first and second transistors, respectively, using the first and second output signals.

Further, the latch includes: a first digital transistor of a positive type switching a transmission of the first output signal according to the programming signal; a second digital transistor of a negative type switching a transmission of the image data according to the programming signal; a fourth digital transistor of a positive type switching a transmission of the digital high level voltage according to the first output signal or the digital low level voltage; a fifth digital transistor of a negative type switching a transmission of the digital low level voltage according to the first output signal or the digital low level voltage; a sixth digital transistor of a positive type switching a transmission of the digital high level voltage according to the second output signal; and a seventh digital transistor of a negative type switching a transmission of the digital low level voltage according to the second output signal, and the level shifter includes: an eighth digital transistor of a positive type switching a transmission of the pin high level voltage according to the third output signal; a ninth digital transistor of a negative type switching a transmission of the pin low level voltage according to the first output signal; a tenth digital transistor of a positive type switching a transmission of the pin high level voltage according to the fourth output signal; and an eleventh digital transistor of a negative type switching a transmission of the pin low level voltage according to the fourth output signal.

In addition, the control circuit part includes an integrated level shifter connected between a pin high level voltage and a pin low level voltage and generating first and second output signals switching the first and second transistors, respectively, using an image data, a programming signal and an emission signal, and the integrated level shifter includes: a first digital transistor of a negative type switching a transmission of the first output signal according to the emission signal; a second digital transistor of a positive type switching a transmission of the first output signal according to the programming signal; a third digital transistor of a negative type switching a transmission of the image data according to the programming signal; a fourth digital transistor of a positive type switching a transmission of the pin high level voltage according to the first output signal or the image data; a fifth digital transistor of a negative type switching a transmission of the pin low level voltage according to the first output signal or the image data; a sixth digital transistor of a positive type switching a transmission of the pin high level voltage according to the emission signal; a seventh digital transistor of a positive type switching a transmission of the pin high level voltage according to the second output signal; and an eighth digital transistor of a negative type switching a transmission of the pin low level voltage according to the second output signal.

Further, the light emitting diode display device further includes a third transistor connected between an anode and a cathode of the light emitting diode, and the first and third transistors have a negative type, and the second transistor has a positive type.

In addition, the light emitting diode display device further includes: a fourth transistor of a negative type switching a connection between a first data signal and a gate of the first transistor according to a first programming signal; a fifth transistor of a negative type switching a connection between a second data signal and a source of the first transistor according to a second programming signal; and a first capacitor connected between a gate and a source of the first transistor.

Further, the light emitting diode display device further includes: a fourth transistor of a negative type switching a connection between a first data signal and a gate of the first transistor according to a programming signal; a fifth transistor of a negative type switching a connection between a second data signal and a source of the first transistor according to the programming signal; and a first capacitor connected between a gate and a source of the first transistor.

In addition, the light emitting diode display device further includes: a fourth transistor of a negative type switching a connection between a data signal and a gate of the first transistor according to a programming signal; a fifth transistor of a negative type switching a connection between a reference signal and a source of the first transistor according to a sense signal; and a first capacitor connected between a gate of the first transistor and a drain of the fifth transistor.

Further, the control circuit part includes: a level shifter connected between a pin high level voltage and a pin low level voltage and generating first and second output signals using first and second image data, a programming signal and an enable signal; and a latch connected between the pin high level voltage and the pin low level voltage and generating third and fourth output signals switching the first and second transistors, respectively, using the first and second output signals, and the level shifter includes: a first digital transistor switching a connection between the pin high level voltage and a drain of a third digital transistor according to the first output signal; a second digital transistor switching a connection between the pin high level voltage and a drain of a fourth digital transistor according to the second output signal; the third digital transistor switching a connection between a drain of the first digital transistor and a drain of a ninth digital transistor according to the first output signal; the fourth digital transistor switching a connection between a drain of the second digital transistor and a drain of the ninth digital transistor according to the second output signal; a fifth digital transistor switching a connection between a drain of the first digital transistor and a drain of the ninth digital transistor according to a voltage of a first electrode of a first capacitor; a sixth digital transistor switching a connection between a drain of the second digital transistor and a drain of the ninth digital transistor according to a voltage of a first electrode of a second capacitor; a seventh digital transistor switching a connection between the first image data and a gate of the fifth digital transistor according to the programming signal; an eighth digital transistor switching a connection between the second image data and a gate of the sixth digital transistor according to the programming signal; and the ninth digital transistor switching a connection between sources of the third to sixth digital transistors and the pin low level voltage according to the enable signal; the first capacitor connected between a source of the seventh digital transistor and the pin low level voltage; and the second capacitor connected between a source of the eighth digital transistor and the pin low level voltage.

In addition, the control circuit part includes: a level shifter connected between a pin high level voltage and a pin low level voltage and generating an output signal using an image data, a programming signal and a precharge signal; and a latch connected between the pin high level voltage and the pin low level voltage and generating third and fourth output signals switching the first and second transistors, respectively, using the output signal, and the level shifter includes: a first digital transistor switching a connection between the pin high level voltage and a drain of a third digital transistor according to the precharge signal; a second digital transistor switching a connection between the pin high level voltage and a drain of a fourth digital transistor according to a voltage of a first electrode of a second capacitor; the third digital transistor switching a connection between a drain of the first digital transistor and a drain of a sixth digital transistor according to the precharge signal; the fourth digital transistor switching a connection between a drain of the second digital transistor and the pin low level voltage according to a voltage of a first electrode of the second capacitor; a fifth digital transistor switching a connection between the image data and a gate of a sixth digital transistor according to a voltage of a first electrode of a first capacitor; the sixth digital transistor switching a connection between a source of the third digital transistor and the pin low level voltage according to a voltage of a first electrode of a first capacitor; the first capacitor connected between a source of the fifth digital transistor and the pin low level voltage; and the second capacitor connected between a gate of the second digital transistor and the pin low level voltage.

Further, the light emitting diode display device further includes a third transistor connected between an anode of the light emitting diode and a test voltage, and the at least one current source includes a first transistor connected between the light emitting diode and an emission high level voltage and having one of a negative type and a positive type, and a cathode of the light emitting diode is connected to an emission low level voltage.

In addition, the control circuit part includes: a latch connected between a digital high level voltage and a digital low level voltage and generating first and second output signals using an image data and a programming signal; and a level shifter connected between a pin high level voltage and a pin low level voltage and generating a third output signal switching the first transistor using the first and second output signals.

Further, the control circuit part includes an integrated level shifter connected between a pin high level voltage and a pin low level voltage and generating a first output signal switching the first transistor using an image data, a programming signal and an emission signal.

In addition, the light emitting diode display device further includes: a fourth transistor of a negative type switching a connection between a first data signal and a gate of the first transistor according to a first programming signal; a fifth transistor of a negative type switching a connection between a second data signal and a source of the first transistor according to a second programming signal; and a first capacitor connected between a gate and a source of the first transistor.

Further, the light emitting diode display device further includes: a fourth transistor of a negative type switching a connection between a first data signal and a gate of the first transistor according to a programming signal; a fifth transistor of a negative type switching a connection between a second data signal and a source of the first transistor according to the programming signal; and a first capacitor connected between a gate and a source of the first transistor.

In addition, the light emitting diode display device of further includes: a fourth transistor of a negative type switching a connection between a data signal and a gate of the first transistor according to a programming signal; a fifth transistor of a negative type switching a connection between a reference signal and a source of the first transistor according to a sense signal; and a first capacitor connected between a gate of the first transistor and a drain of the fifth transistor.

Further, the light emitting diode display device further includes: a fourth transistor of a negative type switching a connection between the first output signal and a source of the first transistor according to a reference signal; a fifth transistor of a negative type switching a connection between the second output signal and a gate of the first transistor according to the reference signal; a sixth transistor of a positive type switching a connection between the emission high level voltage and a source of the first transistor according to a first emission signal; a seventh transistor of a negative type switching a connection between a drain of the first transistor and an anode of the light emitting diode according to a second emission signal; and a first capacitor connected between gate and source of the first transistor, and the control circuit part includes a latch connected between a digital high level voltage and a digital low level voltage and generating first and second output signals using an image data and a programming signal.

In addition, the light emitting diode display device further includes: a fourth transistor of a negative type switching a connection between the first output signal and a gate of the first transistor according to a reference signal; a fifth transistor of a negative type switching a connection between the second output signal and a source of the first transistor according to the reference signal; a sixth transistor of a positive type switching a connection between the emission high level voltage and a drain of the first transistor according to a first emission signal; a seventh transistor of a negative type switching a connection between a source of the first transistor and an anode of the light emitting diode according to a second emission signal; and a first capacitor connected between gate and source of the first transistor, and the control circuit part includes a latch connected between a digital high level voltage and a digital low level voltage and generating first and second output signals using an image data and a programming signal.

Advantageous Effects

The present invention has an effect such that a uniform current is supplied to a light emitting diode even when a source voltage is changed and a uniformity of an emission luminance is improved by connecting a current source transistor and a source follower transistor to an anode and a cathode, respectively, of the light emitting diode.

In addition, the present invention has an effect such that a capability of defect detection in a fabrication process is improved and a fabrication cost is reduced due to repair of a defect by connecting a test transistor to an anode and a cathode of a light emitting diode.

DETAILED DESCRIPTION OF THE EMBODIMENTS

Reference will now be made in detail to the present disclosure, examples of which are illustrated in the accompanying drawings. However, the present invention may be performed in various different embodiments and is not limited to the following examples.

Figure 1:
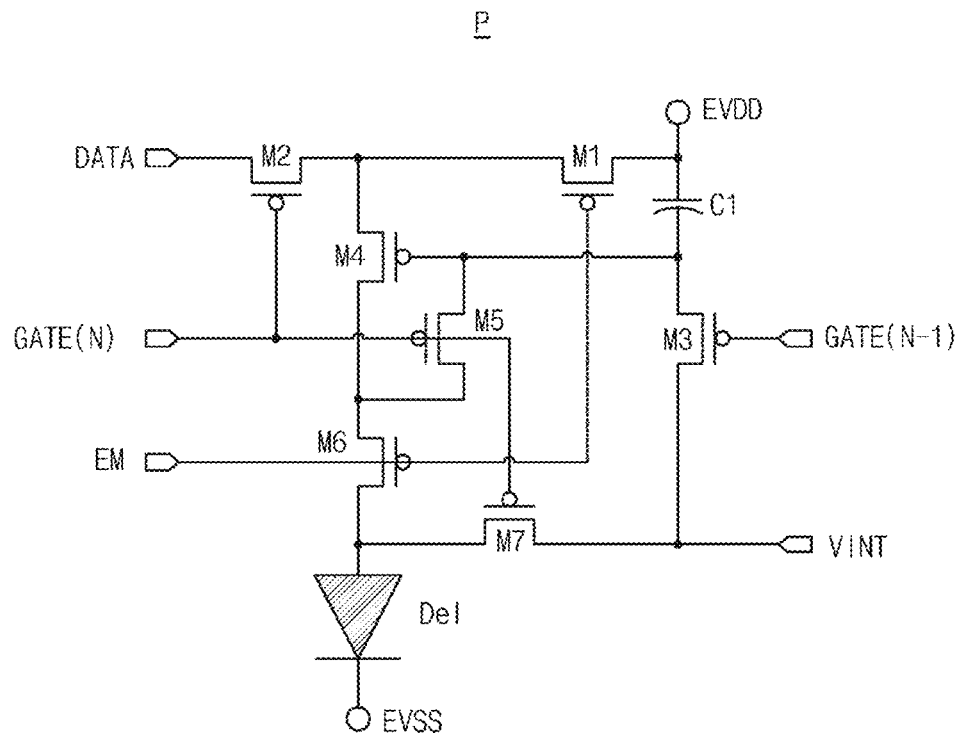
FIG. 1 is a view showing a pixel of an organic light emitting diode display device according to a first example of the related art.
Figure 2:
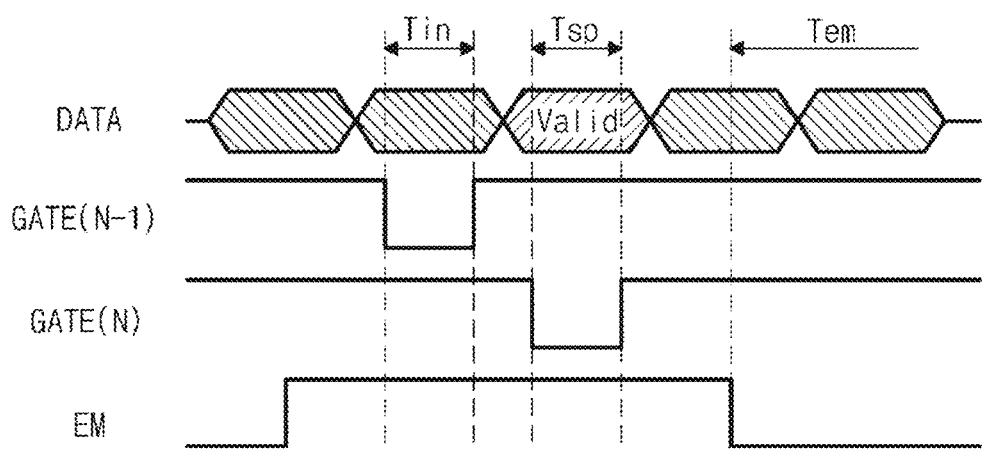
FIG. 2 is a view showing signals of an organic light emitting diode display device according to a first example of a related art.
Figure 3:
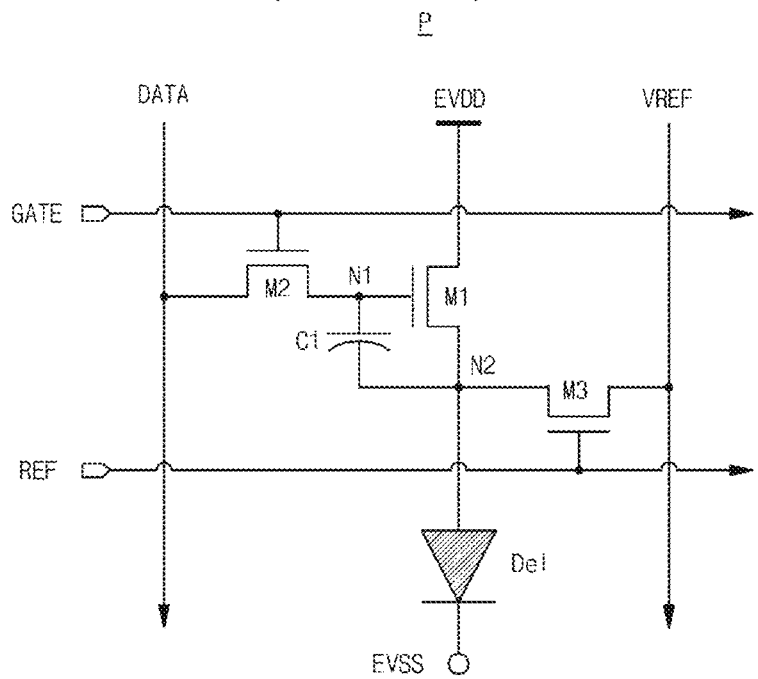
FIG. 3 is a view showing a pixel of an organic light emitting diode display device according to a second example of the related art.
Figure 4:
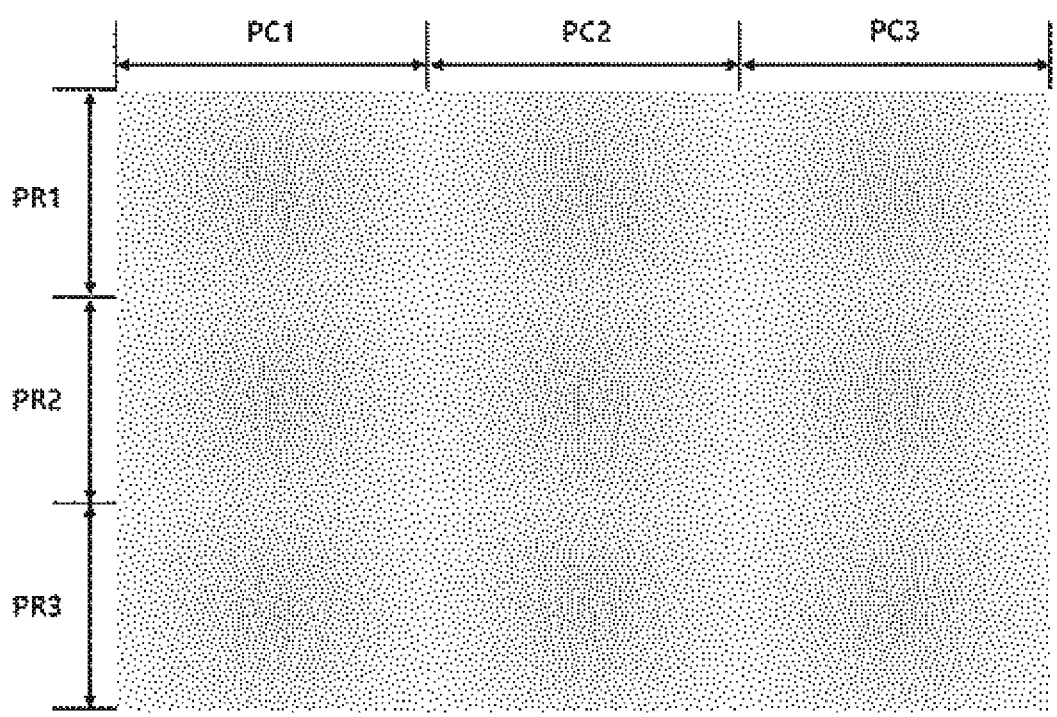
FIG. 4 is a view showing a large-sized display system according to the related art.
Figure 5:
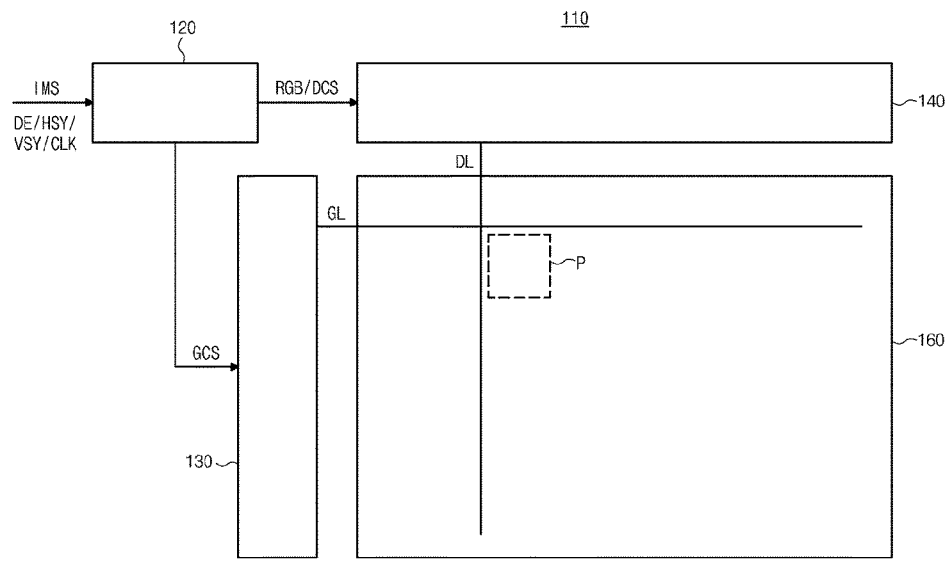
FIG. 5 is a view showing a light emitting diode display device according to a first embodiment of the present disclosure.
Figure 6:
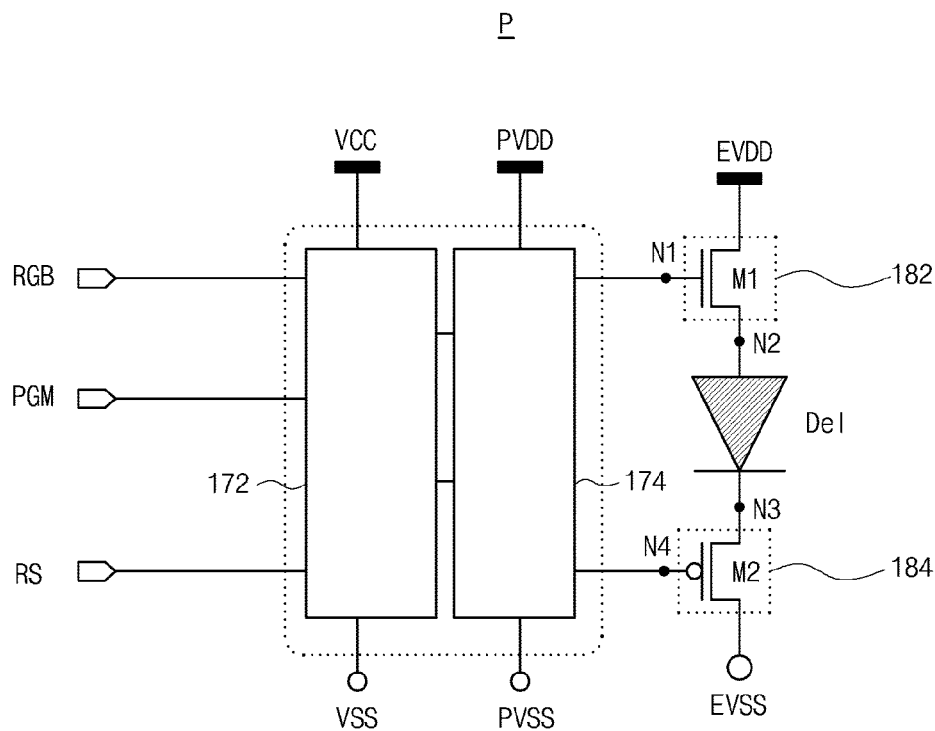
FIG. 6 is a view showing a pixel of a light emitting diode display device according to a first embodiment of the present disclosure.

FIG. 5 is a view showing a light emitting diode display device according to a first embodiment of the present disclosure, and FIG. 6 is a view showing a pixel of a light emitting diode display device according to a first embodiment of the present disclosure.

In FIGS. 5 and 6, a light emitting diode display device 110 according to a first embodiment of the present disclosure includes a timing controlling unit 120, a gate driving unit 130, a data driving unit 140 and a display panel 160.

The timing controlling unit 120 generates an image data RGB, a gate control signal GCS and a data control signal DCS using an image signal IMS and a plurality of timing signals DE, HSY, VSY and CLK received from an external system such as a television system or a graphic card. The timing controlling unit 120 supplies the gate control signal to the gate driving unit 130 and supplies the image data RGV and the data control signal DCS to the data driving unit 140.

The gate driving unit 130 generate a plurality of switching signals such as a gate signal (a gate voltage), a sensing signal and an emission signal using the gate control signal GCS and applies the plurality of switching signals to the display panel 160.

The data driving unit 140 converts the image data RGB to a data signal (a data voltage) using the data control signal DCS and supplies the data signal to the display panel 160 through a data line DL.

The display panel 160 displays an image using the gate signal and the data signal. The display panel 160 includes a gate line GL, a data line DL, a latch (a digital storage element) 172, a level shifter 174, first and second transistors M1 and M2 and a light emitting diode Del. The gate line GL and the data line DL cross each other to define a pixel P, and the latch 172, the level shifter 174, the first and second transistors M1 and M2 and the light emitting diode Del are disposed in each pixel P.

The latch 172 of a control circuit part supplying a control signal to a current source receives the image data RGB, a programming signal PGM and a reset signal RS and outputs first and second output signals using a digital high level voltage VCC and a digital low level voltage VSS. The first and second output signals may be inverted signals to each other.

In another embodiment, the reset signal RS may be omitted.

The level shifter 174 of a control circuit part supplying a control signal to a current source receives the first and second output signals and outputs third and fourth output signals using a pin high level voltage PVDD and a pin low level voltage PVSS. The third and fourth output signals may be inverted signals to each other.

The first transistor M1 functioning as a first current source 182 for a constant current flowing through the light emitting diode Del switches a connection between an emission high level voltage EVDD and the light emitting diode Del according to the third output signal, and the second transistor M2 switches a connection between the light emitting diode Del and an emission low level voltage EVSS according to the fourth output signal.

The first transistor M1 has a negative (N) type. A gate of the first transistor M1 is connected to the third output signal of the level shifter 174 to constitute a first node N1. A drain of the first transistor M1 is connected to the emission high level voltage EVDD, and a source of the first transistor M1 is connected to an anode of the light emitting diode Del to constitute a second node N2.

The second transistor M2 functioning as a second current source 184 for a constant current flowing through the light emitting diode Del has a positive (P) type. A source of the second transistor M2 is connected to a cathode of the light emitting diode Del to constitute a third node N3. A gate of the second transistor M2 is connected to the fourth output signal of the level shifter 174 to constitute a fourth node N4, and a drain of the second transistor M2 is connected to the emission low level voltage EVSS.

The first and second transistors M1 and M2 and the light emitting diode Del constitute an emission part of each pixel P.

In the pixel P, a current level of the light emitting diode Del is determined by voltages of the first and fourth nodes N1 and N4 and an operation property (L-I-V characteristics) of the light emitting diode Del.

A voltage condition of a steady state is expressed by a following equation (1).

$$V(N1) - V(N4) = Vgs(M1) + V(Del) + Vsg(M2) \quad \text{equation (1)}$$

V(N1) is a voltage of the first node N1, V(N4) is a voltage of the fourth node N4, Vgs(M1) is a voltage difference between the gate and source of the first transistor M1, V(Del) is a voltage difference between the anode and the cathode of the light emitting diode Del, and Vsg(M2) is a voltage difference between the source and the gate of the second transistor M2.

The equation (1) is changed to a following equation (2) by voltages of the first to fourth nodes N1 to N4.

$$V(N1) - V(N4) = \quad \text{equation (2)}$$
$$\{V(N1) - V(N2)\} + \{V(N2) - V(N3)\} + \{V(N3) - V(N4)\}$$

V(N2) is a voltage of the second node N2, and V(N3) is a voltage of the third node N3.

The current level of the light emitting diode Del is determined by the voltages of the first and fourth nodes N1 and N4 and the operation property of the light emitting diode Del regardless of the emission high level voltage EVDD and the emission low level voltage EVSS. When a voltage drop due to a direct current (DC) bypass current does not occur in the level shifter 174, a constant current flows through the light emitting diode Del regardless of a luminance of the image.

When the level shifter 174 outputs the third and fourth output signals using the first and second output signals of the latch 172 of a digital storage element, the DC by pass current in the level shifter 174 may be prevented. As a result, when the luminance of the image does not exceed a tolerance limit (when the first and second transistors M1 and M2 as a source follower for emission operate in a saturation region), the light emitting diode Del may emit a light of a constant luminance.

Here, the image data RGB inputted to the latch 172 has a digital type of a digital voltage level.

In the pixel P of the light emitting diode display device 110 according to a first embodiment of the present disclosure, the latch 172 outputs the first and second output signals of a constant direct current (DC) voltage level for preventing a flicker, etc., and the level shifter 174 applies the third and fourth output signals necessary for an emission to the gates of the first and fourth transistors M1 and M4. As a result, a constant current may flow through the light emitting diode Del regardless of a change of the emission high level voltage EVDD and the emission low level voltage EVSS.

Further, when the pixel P includes the light emitting diode Del emitting a red colored light, a green colored light and a blue colored light, a current reflecting an operation property difference of red, green and blue light emitting diodes Del may flow through the light emitting diode Del by adjusting an aspect ratio of the first and second transistors M1 and M2.

The latch 172 and the level shifter 174 including a plurality of transistors will be illustrated with reference to drawings.

Figure 7:
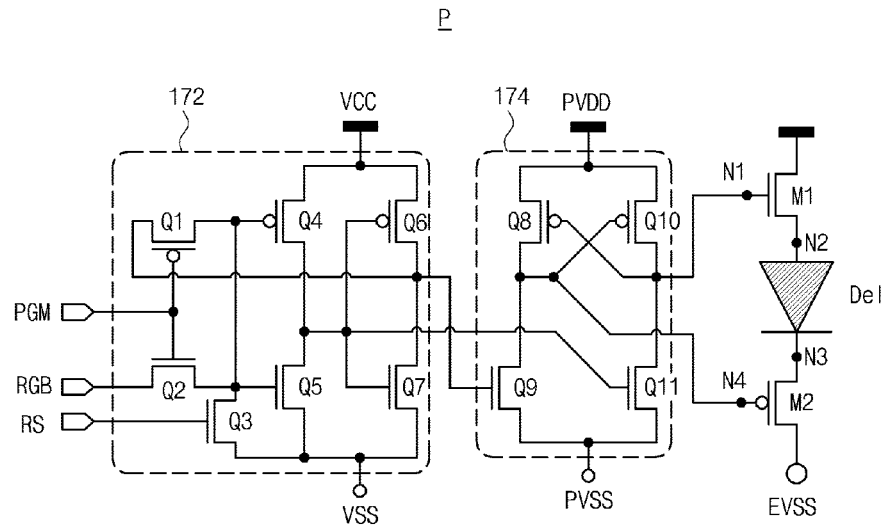
FIG. 7 is a view showing a pixel of a light emitting diode display device according to a first embodiment of the present disclosure.
Figure 8:
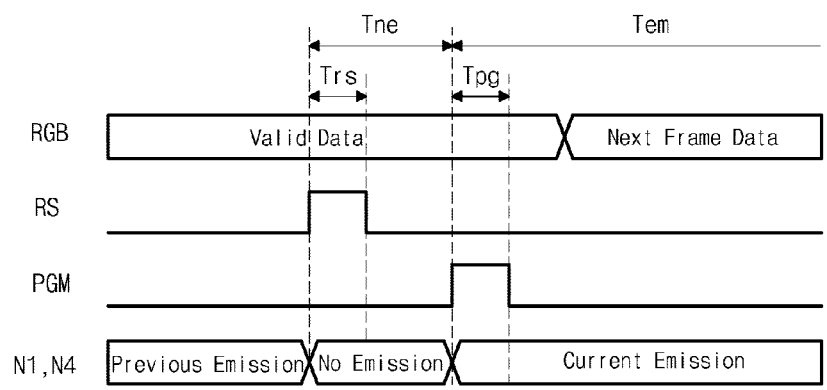
FIG. 8 is a view showing signals used for a pixel of a light emitting diode display device according to a first embodiment of the present disclosure.

FIG. 7 is a view showing a pixel of a light emitting diode display device according to a first embodiment of the present disclosure, and FIG. 8 is a view showing signals used for a pixel of a light emitting diode display device according to a first embodiment of the present disclosure.

In FIG. 7, the pixel P of the light emitting diode display device 110 according to a first embodiment of the present disclosure includes the latch 172, the level shifter 174, the first and second transistors M1 and M2 and the light emitting diode Del. The latch 172 includes first to seventh digital transistors Q1 to Q7, and the level shifter 174 includes eighth to eleventh digital transistors Q8 to Q11. The first and second transistors M1 and M2 and the light emitting diode Del constitute an emission part.

The first, fourth, sixth, eighth and tenth digital transistors Q1, Q4, Q6, Q8 and Q10 have a positive (P) type, and the second, third, fifth, seventh, ninth and eleventh digital transistors Q2, Q3, Q5, Q7, Q9 and Q11 have a negative (N) type.

The first digital transistor Q1 switches a connection between the first output signal and gates of the fourth and fifth digital transistors Q4 and Q5 according to the programming signal PGM for inputting the image data RGB to the latch 172, and the second digital transistor Q2 switches a connection between the image data RGB and gates of the fourth and fifth digital transistors Q4 and Q5 according to the programming signal PGM.

The third digital transistor Q3 switches a connection between the digital low level voltage VSS and the gates of the fourth and fifth digital transistors Q4 and Q5 according to the reset signal RS for resetting the latch 172.

In another embodiment, the reset signal RS and the third digital transistor Q3 may be omitted.

The fourth digital transistor Q4 switches a connection between the digital high level voltage VCC and the second output signal according to the first output signal or the digital low level voltage VSS, and the fifth digital transistor Q5 switches a connection between the digital low level voltage VSS and the second output signal according to the first output signal or the digital low level voltage VSS.

The sixth digital transistor Q6 switches a connection between the digital high level voltage VCC and the first output signal according to the second output signal, and the seventh digital transistor Q7 switches a connection between the digital low level voltage VSS and the second output signal according to the second output signal.

The eighth digital transistor Q8 switches a connection between the pin high level voltage PVDD and the fourth output signal according to the third output signal, and the ninth digital transistor Q9 switches a connection between the pin low level voltage PVSS and the fourth output signal according to the first output signal.

The tenth digital transistor Q10 switches a connection between the pin high level voltage PVDD and the third output signal according to the fourth output signal, and the eleventh digital transistor Q11 switches a connection between the pin low level voltage PVSS and the third output signal according to the fourth output signal.

Here, the pin high level voltage PVDD and the pin low level voltage PVSS may have a voltage level such that a necessary current flows through the first and second transistors M1 and M2 for an emission and the light emitting diode Del and the first and second transistors M1 and M2 operate in the saturation region for a normal operation of a source follower.

For example, the pin high level voltage PVDD may be greater than the digital high level voltage VCC and smaller than the emission high level voltage EVDD.

In FIG. 8, the image data RGB has the valid period in each frame, the reset signal RS has a high level during the reset period Trs corresponding to the valid period of the present frame of the image data RGB, the programming signal PGM has a high level during the programming period Tpg corresponding to the valid period of the present frame of the image data RGB.

During the reset period Trs, the first and second output signals of the latch 172 become a low level (0) and a high level (1), respectively, and are inputted to the level shifter 174. Further, the third and fourth output signals of the level shifter 174 become a low level (0) and a high level (1), respectively, and are transmitted to the first and fourth nodes N1 and N4, respectively. As a result, each of the first and second transistors M1 and M2 is turned off, and the light emitting diode Del does not emit a light.

During the programming period Tpg, the first and second output signals of the latch 172 become a high level (1) and a low level (0), respectively, and are inputted to the level shifter 174. Further, the third and fourth output signals of the level shifter 174 become a high level (1) and a low level (0), respectively, and are transmitted to the first and fourth nodes N1 and N4, respectively. As a result, each of the first and second transistors M1 and M2 is turned on, and the light emitting diode Del emits a light.

A period between a rising timing of the reset period Trs and a rising timing of the programming period Tpg becomes a non-emission period Tne where the light emitting diode Del does not emit a light, and a period between the rising timing of the programming period Tpg and the rising timing of the reset period Trs of a next frame become an emission period Tem where the light emitting diode Del emits a light.

In the light emitting diode display device 110 according to a first embodiment of the present disclosure, the first and second transistors M1 and M2 are connected to the anode and the cathode, respectively, of the light emitting diode Del, and the first and second transistors M1 and M2 are switched using the latch 172 of a digital storage element outputting the first and second output signals of a constant DC voltage level and the level shifter 174 outputting the third and fourth output signals of a necessary voltage level for an emission. As a result, a constant current may flow through the light emitting diode Del regardless of a change of the emission high level voltage EVDD and the emission low level voltage EVSS, and a uniformity of an emission luminance is improved.

Another embodiment where the reset period is not used will be illustrated with reference to a drawing.

Figure 9:
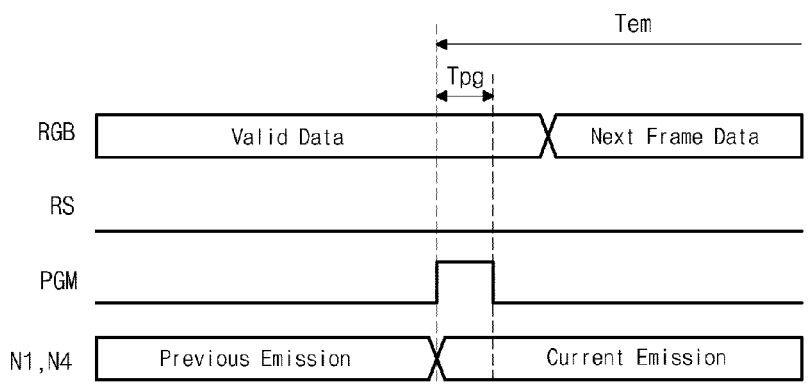
FIG. 9 is a view showing signals used for a pixel of a light emitting diode display device according to a second embodiment of the present disclosure.

FIG. 9 is a view showing signals used for a pixel of a light emitting diode display device according to a second embodiment of the present disclosure. Illustration on a part the same as a part of the first embodiment will be omitted.

In FIG. 9, the image data RGB has the valid period in each frame, the reset signal RS has a low level, the programming signal PGM has a high level during the programming period Tpg corresponding to the valid period of the present frame of the image data RGB.

During the programming period Tpg, the first and second output signals of the latch 172 become a high level (1) and a low level (0), respectively, and are inputted to the level shifter 174. Further, the third and fourth output signals of the level shifter 174 become a high level (1) and a low level (0), respectively, and are transmitted to the first and fourth nodes N1 and N4, respectively. As a result, each of the first and second transistors M1 and M2 is turned on, and the light emitting diode Del emits a light.

A period between a rising timing of the programming period Tpg and a rising timing of the programming period Tpg of a next frame become an emission period Tem where the light emitting diode Del emits a light.

In the light emitting diode display device according to a second embodiment of the present disclosure, the first and second transistors M1 and M2 are connected to the anode and the cathode, respectively, of the light emitting diode Del, and the first and second transistors M1 and M2 are switched using the latch 172 and the level shifter 174. As a result, the a constant current may flow through the light emitting diode Del regardless of a change of the emission high level voltage EVDD and the emission low level voltage EVSS, and a uniformity of an emission luminance is improved.

Another embodiment where both electrodes of the light emitting diode are connected to a test transistor to perform a detection and a repair of a defect will be illustrated with reference to a drawing.

Figure 10:
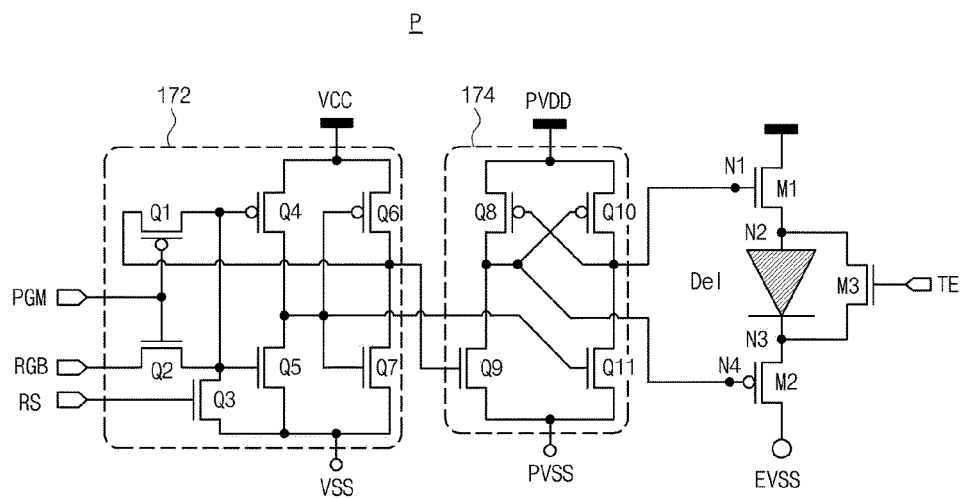
FIG. 10 is a view showing a pixel of a light emitting diode display device according to a third embodiment of the present disclosure.

FIG. 10 is a view showing a pixel of a light emitting diode display device according to a third embodiment of the present disclosure. Illustration on a part the same as a part of the first and second embodiments will be omitted.

In FIG. 10, the pixel P of the light emitting diode display device according to a third embodiment of the present disclosure includes the latch 172, the level shifter 174, the first, second and third transistors M1, M2 and M3 and the light emitting diode Del. The latch 172 includes first to seventh digital transistors Q1 to Q7, and the level shifter 174 includes eighth to eleventh digital transistors Q8 to Q11. The first, second and third transistors M1, M2 and M3 and the light emitting diode Del constitute an emission part.

The first transistor M1 functioning as a current source for a constant current flowing through the light emitting diode Del switches a connection between an emission high level voltage EVDD and the light emitting diode Del according to the third output signal, and the second transistor M2 switches a connection between the light emitting diode Del and an emission low level voltage EVSS according to the fourth output signal. The third transistor M3 switches a connection between the anode and the cathode of the light emitting diode Del according to a test signal TE.

A gate of the first transistor M1 of a negative (N) type is connected to the third output signal of the level shifter 174 to constitute a first node N1. A drain of the first transistor M1 is connected to the emission high level voltage EVDD, and a source of the first transistor M1 is connected to an anode of the light emitting diode Del to constitute a second node N2.

A source of the second transistor M2 of a positive (P) type is connected to a cathode of the light emitting diode Del to constitute a third node N3. A gate of the second transistor M2 is connected to the fourth output signal of the level shifter 174 to constitute a fourth node N4, and a drain of the second transistor M2 is connected to the emission low level voltage EVSS.

A drain and a source of the third transistor M3 of a negative (N) type are connected to the second and third nodes N2 and N3, respectively, and a gate of the third transistor M3 is connected to the test signal TE.

The light emitting diode display device according to a third embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, a defect of the first to eleventh digital transistors Q1 to Q11 of the latch 172 and the level shifter 174 and the first and second transistors M1 and M2 is detected using the image data RGB, the reset signal RS and the programming signal PGM.

Here, before the light emitting diode Del is connected between the second and third nodes N2 and N3 in a fabrication process, it may be detected by turning on the third transistor M3 whether the other elements except for the light emitting diode Del normally operate or not.

After the light emitting diode Del is connected between the second and third nodes N2 and N3 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

In the light emitting diode display device according to a third embodiment of the present disclosure, the first and second transistors M1 and M2 are connected to the anode and the cathode, respectively, of the light emitting diode Del, and the first and second transistors M1 and M2 are switched using the latch 172 and the level shifter 174. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode and the cathode of the light emitting diode Del and the third transistor M3 is turned on, a defect of a fabrication process may be detected to be repaired and a fabrication cost may be reduced.

Although the second transistor M2 is connected between the cathode of the light emitting diode Del and the emission low level voltage EVSS in a third embodiment of FIG. 10, the second transistor M2 may be omitted and the cathode of the light emitting diode Del may be directly connected to the emission low level voltage EVSS in another embodiment. Another embodiment where the level shifter 174 outputs the third output signal and does not output the fourth output signal and the source of the third transistor M3 is connected to a test voltage TM instead of the third node N3 will be illustrated with reference to FIGS. 14 and 15.

Another embodiment where the latch and the level shifter constitute one level shifter will be illustrated with reference to drawings.

Figure 11:
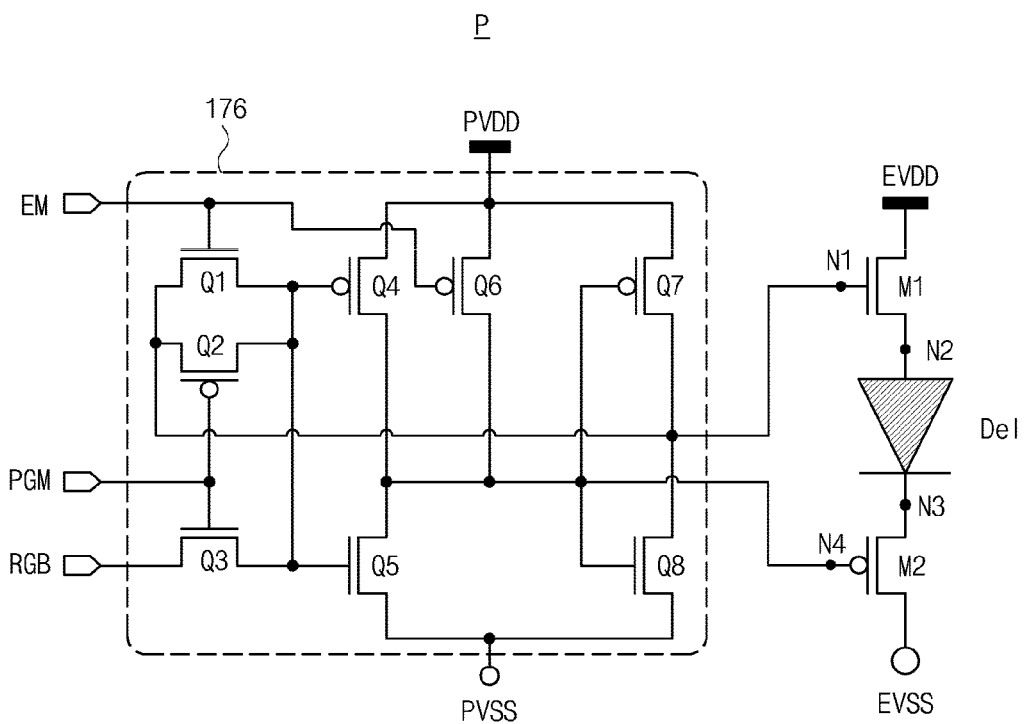
FIG. 11 is a view showing a pixel of a light emitting diode display device according to a fourth embodiment of the present disclosure.
Figure 12:
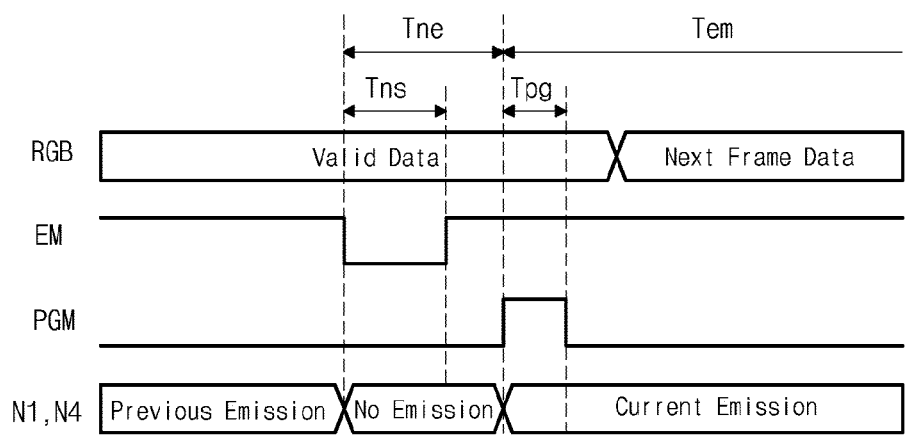
FIG. 12 is a view showing signals used for a pixel of a light emitting diode display device according to a fourth embodiment of the present disclosure.

FIG. 11 is a view showing a pixel of a light emitting diode display device according to a fourth embodiment of the present disclosure, and FIG. 12 is a view showing signals used for a pixel of a light emitting diode display device according to a fourth embodiment of the present disclosure. Illustration on a part the same as a part of the first to third embodiments will be omitted.

In FIG. 11, the pixel P of the light emitting diode display device according to a fourth embodiment of the present disclosure includes an integrated level shifter 176, the first and second transistors M1 and M2 and the light emitting diode Del. The first and second transistors M1 and M2 and the light emitting diode Del constitute an emission part.

The integrated level shifter 176 of the control circuit part supplying the control signal to the current source receives the image data RGB, the programming signal PGM and the emission signal EM and outputs the first and second output signals using the pin high level voltage PVDD and the pin low level voltage PVSS. The first and second output signals may be inverted signals to each other.

The first transistor M1 functioning as a current source for a constant current flowing through the light emitting diode Del switches a connection between the emission high level voltage EVDD and the light emitting diode Del according to the first output signal, and the second transistor M2 functioning as a current source for a constant current flowing through the light emitting diode Del switches a connection between the light emitting diode Del and the emission low level voltage EVSS according to the second output signal.

The first transistor M1 has a negative (N) type. A gate of the first transistor M1 is connected to the first output signal of the integrated level shifter 176 to constitute a first node N1. A drain of the first transistor M1 is connected to the emission high level voltage EVDD, and a source of the first transistor M1 is connected to the anode of the light emitting diode Del to constitute a second node N2.

The second transistor M2 has a positive (P) type. A source of the second transistor M2 is connected to the cathode of the light emitting diode Del to constitute a third node N3. A gate of the second transistor M2 is connected to the second output signal of the integrated level shifter 176 to constitute a fourth node N4, and a drain of the second transistor M2 is connected to the emission low level voltage EVSS.

The integrated level shifter 176 includes first to eighth digital transistors Q1 to Q8.

The second, fourth, sixth and seventh digital transistors Q2, Q4, Q6 and Q7 have a positive (P) type, and the first, third, fifth and eighth digital transistors Q1, Q3, Q5 and Q8 have a negative (N) type.

The first digital transistor Q1 switches a connection between the first output signal and gates of the fourth and fifth digital transistors Q4 and Q5 according to the emission signal EM, and the second digital transistor Q2 switches a connection between the first output signal and the gates of the fourth and fifth digital transistors Q4 and Q5 according to the programming signal PGM.

The third digital transistor Q3 switches a connection between the image data RGB and the gates of the fourth and fifth digital transistors Q4 and Q5 according to the programming signal PGM.

The fourth digital transistor Q4 switches a connection between the pin high level voltage PVDD and the second output signal according to the first output signal or the image data RGB, and the fifth digital transistor Q5 switches a connection between the pin low level voltage PVSS and the second output signal according to the first output signal or the image data RGB.

The sixth digital transistor Q6 switches a connection between the pin high level voltage PVDD and the second output signal according to the emission signal, and the seventh digital transistor Q7 switches a connection between the pin high level voltage PVDD and the first output signal according to the second output signal. The eighth digital transistor Q8 switches a connection between the pin low level voltage PVSS and the first output signal according to the second output signal.

Here, the pin high level voltage PVDD and the pin low level voltage PVSS may have a voltage level such that a necessary current flows through the first and second transistors M1 and M2 for an emission and the light emitting diode Del and the first and second transistors M1 and M2 operate in the saturation region for a normal operation of a source follower.

For example, the pin high level voltage PVDD may be smaller than the emission high level voltage EVDD.

Further, the integrated level shifter 176 may perform a function of converting a voltage of the image data RGB to a level of the pin high level voltage PVDD and the pin low level voltage PVSS and a function of storing the image data RGB by adjusting an aspect ratio of the first to eighth digital transistors Q1 to Q8.

In FIG. 12, the image data RGB has the valid period in each frame, the emission signal EM has a low level during a non-storing period Tns corresponding to the valid period of the present frame of the image data RGB, and the programming signal PGM has a high level during the programming period Tpg corresponding to the valid period of the present frame of the image data RGB.

During the non-storing period Tns, the first and second output signals of the integrated level shifter 176 become a low level (0) and a high level (1), respectively, and are transmitted to the first and fourth nodes N1 and N4, respectively. As a result, each of the first and second transistors M1 and M2 is turned off, and the light emitting diode Del does not emit a light.

During the programming period Tpg, the first and second output signals of the integrated level shifter 176 become a high level (1) and a low level (0), respectively, and are transmitted to the first and fourth nodes N1 and N4, respectively. As a result, each of the first and second transistors M1 and M2 is turned on, and the light emitting diode Del emits a light.

A period between a falling timing of the non-storing period Tns and a rising timing of the programming period Tpg becomes a non-emission period Tne where the light emitting diode Del does not emit a light, and a period between the rising timing of the programming period Tpg and the falling timing of the non-storing period Tns of a next frame become an emission period Tem where the light emitting diode Del emits a light.

During a period where the emission signal EM has a high level and the programming signal has a low level, the image data RGB is stored in the integrated level shifter 176.

In the light emitting diode display device according to a fourth embodiment of the present disclosure, the first and second transistors M1 and M2 are connected to the anode and the cathode, respectively, of the light emitting diode Del, and the first and second transistors M1 and M2 are switched using the integrated level shifter 176. As a result, a constant current may flow through the light emitting diode Del regardless of a change of the emission high level voltage EVDD and the emission low level voltage EVSS, and a uniformity of an emission luminance is improved.

Another embodiment where both electrodes of the light emitting diode are connected to a test transistor to perform a detection and a repair of a defect will be illustrated with reference to a drawing.

Figure 13:
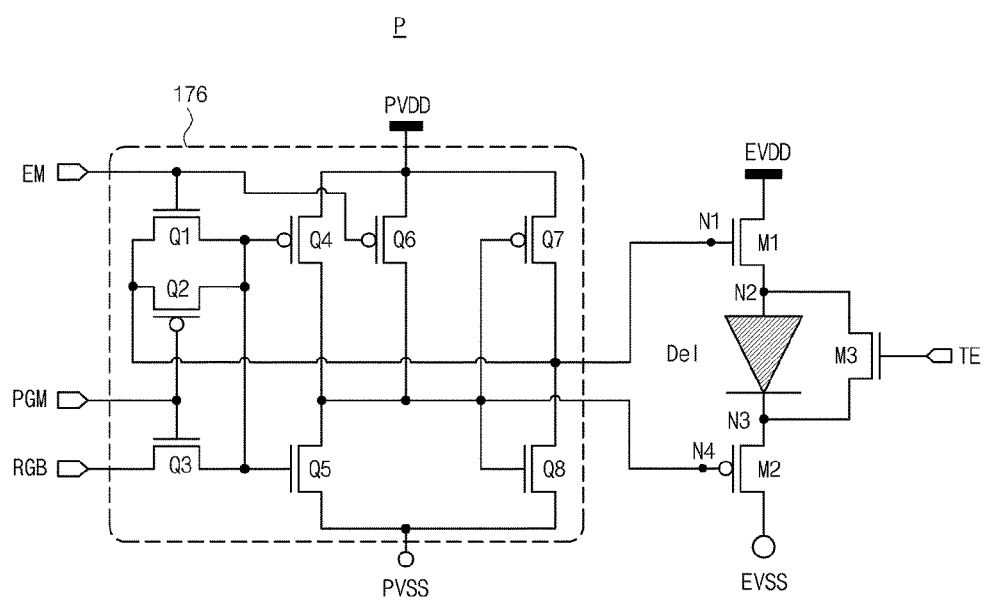
FIG. 13 is a view showing a pixel of a light emitting diode display device according to a fifth embodiment of the present disclosure.

FIG. 13 is a view showing a pixel of a light emitting diode display device according to a fifth embodiment of the present disclosure. Illustration on a part the same as a part of the first to fourth embodiments will be omitted.

In FIG. 13, the pixel P of the light emitting diode display device according to a fifth embodiment of the present disclosure includes the integrated level shifter 176, the first, second and third transistors M1, M2 and M3 and the light emitting diode Del. The integrated level shifter 176 includes first to eighth digital transistors Q1 to Q8. The first, second and third transistors M1, M2 and M3 and the light emitting diode Del constitute an emission part.

The first transistor M1 functioning as a current source for a constant current flowing through the light emitting diode Del switches a connection between the emission high level voltage EVDD and the light emitting diode Del according to the first output signal, and the second transistor M2 functioning as a current source for a constant current flowing through the light emitting diode Del switches a connection between the light emitting diode Del and the emission low level voltage EVSS according to the second output signal. The third transistor M3 switches a connection between the anode and the cathode of the light emitting diode Del according to the test signal TE.

A gate of the first transistor M1 of a negative (N) type is connected to the first output signal of the integrated level shifter 176 to constitute a first node N1. A drain of the first transistor M1 is connected to the emission high level voltage EVDD, and a source of the first transistor M1 is connected to an anode of the light emitting diode Del to constitute a second node N2.

A source of the second transistor M2 of a positive (P) type is connected to the cathode of the light emitting diode Del to constitute a third node N3. A gate of the second transistor M2 is connected to the second output signal of the integrated level shifter 176 to constitute a fourth node N4, and a drain of the second transistor M2 is connected to the emission low level voltage EVSS.

A drain and a source of the third transistor M3 of a negative (N) type are connected to the second and third nodes N2 and N3, respectively, and a gate of the third transistor M3 is connected to the test signal TE.

The light emitting diode display device according to a fifth embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, a defect of the first to eighth digital transistors Q1 to Q8 of the integrated level shifter 176 and the first and second transistors M1 and M2 is detected using the image data RGB, the programming signal PGM and the emission signal EM.

Here, before the light emitting diode Del is connected between the second and third nodes N2 and N3 in a fabrication process, it may be detected by turning on the third transistor M3 whether the other elements except for the light emitting diode Del normally operate or not.

After the light emitting diode Del is connected between the second and third nodes N2 and N3 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

In the light emitting diode display device according to a fifth embodiment of the present disclosure, the first and second transistors M1 and M2 are connected to the anode and the cathode, respectively, of the light emitting diode Del, and the first and second transistors M1 and M2 are switched using the integrated level shifter 176. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode and the cathode of the light emitting diode Del and the third transistor M3 is turned on, a defect of a fabrication process may be detected to be repaired and a fabrication cost may be reduced.

Another embodiment where the second transistor M2 is omitted and the cathode of the light emitting diode Del is directly connected to the emission low level voltage EVSS will be illustrated with reference to drawings.

Figure 14:
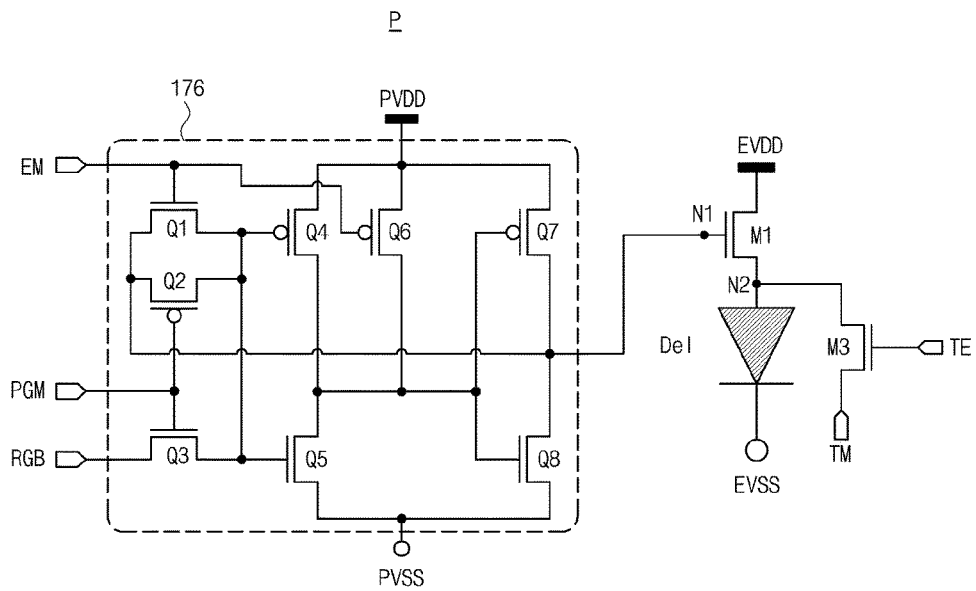
FIG. 14 is a view showing a pixel of a light emitting diode display device according to a sixth embodiment of the present disclosure.
Figure 15:
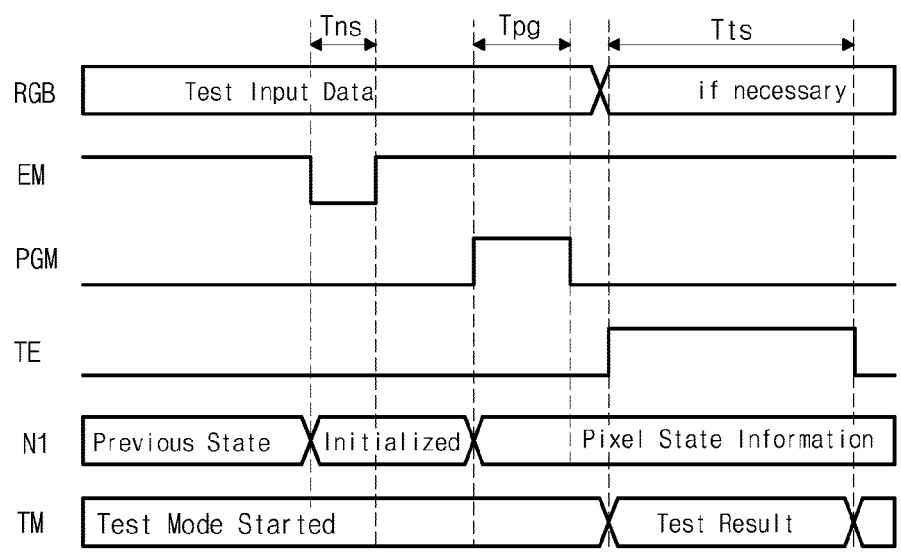
FIG. 15 is a view showing signals used for a pixel of a light emitting diode display device according to a sixth embodiment of the present disclosure.

FIG. 14 is a view showing a pixel of a light emitting diode display device according to a sixth embodiment of the present disclosure, and FIG. 15 is a view showing signals used for a pixel of a light emitting diode display device according to a sixth embodiment of the present disclosure. Illustration on a part the same as a part of the first to fifth embodiments will be omitted.

In FIG. 14, the pixel P of the light emitting diode display device according to a sixth embodiment of the present disclosure includes the integrated level shifter 176, the first and third transistors M1 and M3 and the light emitting diode Del. The first and third transistors M1 and M3 and the light emitting diode Del constitute an emission part.

The integrated level shifter 176 of the control circuit part supplying the control signal to the current source includes the first to eighth digital transistors Q1 to Q8. The integrated level shifter 176 receives the image data RGB, the programming signal PGM and the emission signal EM and outputs the first output signal using the pin high level voltage PVDD and the pin low level voltage PVSS.

The first transistor M1 functioning as a current source for a constant current flowing through the light emitting diode Del switches a connection between the emission high level voltage EVDD and the light emitting diode Del according to the first output signal, and the third transistor M3 switches a connection between the anode of the light emitting diode Del and the test voltage TM according to the test signal TE.

A gate of the first transistor M1 of a negative (N) type is connected to the first output signal of the integrated level shifter 176 to constitute a first node N1. A drain of the first transistor M1 is connected to the emission high level voltage EVDD, and a source of the first transistor M1 is connected to the anode of the light emitting diode Del to constitute a second node N2.

A drain and a source of the third transistor M3 of a negative (N) type are connected to the second node N2 and the test voltage TM, respectively, and a gate of the third transistor M3 is connected to the test signal TE.

The light emitting diode display device according to a sixth embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, since the second node N2 is initialized with the test voltage TM, it may be prevented that a voltage of the second node N2 is reduced lower than a predetermined voltage or a property of the first transistor M1 or the light emitting diode Del may be detected.

In the test mode of the light emitting diode display device of FIG. 15, the image data RGB has a test (input) data period, and the emission signal EM has a low level during a non-storing period Tns corresponding to the test data period of the image data RGB. The programming signal PGM has a high level during the programming period Tpg corresponding to the test data period of the image data RGB, and the test signal TE has a high level during a test period Tts corresponding to a next frame of the image data RGB.

During the non-storing period Tns, the first output signal of the integrated level shifter 176 becomes a high level (1) and is transmitted to the first node N1, and the gate of the first transistor M1 is initialized.

During the programming period Tpg, the first output signal of the integrated level shifter 176 becomes a high level (1) and is transmitted to the first node N1. As a result, the gate of the first transistor M1 reflects a pixel state.

During the test period Tts, the test signal TE becomes a high level (1), and the third transistor M3 is turned on. As a result, the test voltage TM is transmitted to the second node N2 of the source of the first transistor M1, and a property change of the first transistor M1 or the light emitting diode Del is detected.

In the light emitting diode display device according to a sixth embodiment of the present disclosure, the first transistor M is connected to the anode of the light emitting diode Del, and the first transistor M1 is switched using the integrated level shifter 176. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode of the light emitting diode Del and the third transistor M3 is turned on, a defect of a fabrication process may be detected to be repaired and a fabrication cost may be reduced.

Another embodiment where the anode and the cathode of the light emitting diode are connected to a current source and a source follower, respectively, will be illustrated with reference to a drawing.

Figure 16:
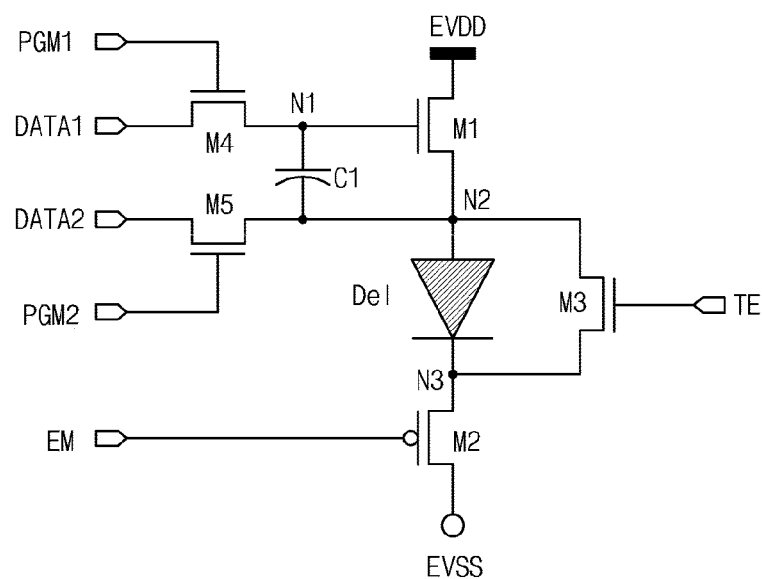
FIG. 16 is a view showing an emission part of a pixel of a light emitting diode display device according to a seventh embodiment of the present disclosure.

FIG. 16 is a view showing an emission part of a pixel of a light emitting diode display device according to a seventh embodiment of the present disclosure. Illustration on a part the same as a part of the first to sixth embodiments will be omitted.

In FIG. 16, an emission part of the pixel P of the light emitting diode display device according to a seventh embodiment of the present disclosure includes the first, third, fourth and fifth transistors M1, M3, M4 and M5 of a negative (N) type, the second transistor of a positive (P) type, the first capacitor C1 and the light emitting diode Del.

The first transistor M1 functioning as a current source for a constant current flowing through the light emitting diode Del switches a connection between the emission high level voltage EVDD and the light emitting diode Del according to the voltage of the first node N1, and the second transistor M2 functioning as a current source for a constant current flowing through the light emitting diode Del switches a connection between the light emitting diode Del and the emission low level voltage EVSS according to the voltage of the third node N3. The third transistor M3 switches a connection between the anode and the cathode of the light emitting diode Del according to the test signal TE.

The fourth transistor M4 of the control circuit part supplying the control signal to the current source switches a connection between a first data signal DATA1 and the first node N1 according to a first programming signal PGM1, the fifth transistor M5 of the control circuit part supplying the control signal to the current source switches a connection between a second data signal DATA2 and the second node N2 according to a second programming signal PGM2.

The first transistor M1 has a negative (N) type, and a gate of the first transistor M1 is connected to the first node N1. A drain of the first transistor M1 is connected to the emission high level voltage EVDD, and a source of the first transistor M1 is connected to the second node N2.

The second transistor M2 has a positive (P) type, and a gate of the second transistor M2 is connected to the emission signal EM. A source of the second transistor M2 is connected to the third node N3, and a drain of the second transistor M2 is connected to the emission low level voltage EVSS.

The third transistor M3 has a negative (N) type, and a gate of the third transistor M3 is connected to the test signal TE. A drain of the third transistor M3 is connected to the second node N2, and a source of the third transistor M3 is connected to the third node N3.

The fourth transistor M4 has a negative (N) type, and a gate of the fourth transistor M4 is connected to the first programming signal PGM1. A drain of the fourth transistor M4 is connected to the first data signal DATA1, and a source of the fourth transistor M4 is connected to the first node N1.

The fifth transistor M4 has a negative (N) type, and a gate of the fifth transistor M5 is connected to the second programming signal PGM2. A drain of the fifth transistor M5 is connected to the second data signal DATA2, and a source of the fifth transistor M5 is connected to the second node N2.

The first and second electrodes of the first capacitor C1 of the control circuit part supplying the control signal to the current source are connected to the first and second nodes N1 and N2, respectively.

The anode and the cathode of the light emitting diode Del are connected to the second and third nodes N2 and N3, respectively.

The gate of the first transistor M1, the source of the fourth transistor M4 and the first electrode of the first capacitor C1 constitute the first node N1, the source of the first transistor M1, the drain of the third transistor M3, the source of the fifth transistor M5, the second electrode of the first capacitor C1 and the anode of the light emitting diode Del constitute the second node N2, and the source of the second transistor M2, the source of the third transistor M3 and the cathode of the light emitting diode Del constitute the third node N3.

The light emitting diode display device according to a seventh embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, a defect of the first to fifth transistors M1 to M5 is detected using the first and second data signals DATA1 and DATA2, the first and second programming signals PGM1 and PGM2 and the emission signal EM.

Here, before the light emitting diode Del is connected between the second and third nodes N2 and N3 in a fabrication process, it may be detected by turning on the third transistor M3 whether the other elements except for the light emitting diode Del normally operate or not.

After the light emitting diode Del is connected between the second and third nodes N2 and N3 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

In the light emitting diode display device according to a seventh embodiment of the present disclosure, the first and second transistors M1 and M2 are connected to the anode and the cathode, respectively, of the light emitting diode Del, and the first and second transistors M1 and M2 function as a current source and a source follower, respectively, using the fourth and fifth transistors M4 and M5. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode and the cathode of the light emitting diode Del and the third transistor M3 is turned on, a defect of a fabrication process may be detected to be repaired and a fabrication cost may be reduced.

Although the second transistor M2 is connected between the cathode of the light emitting diode Del and the emission low level voltage EVSS in a seventh embodiment of FIG. 16, the second transistor M2 may be omitted and the cathode of the light emitting diode Del may be directly connected to the emission low level voltage EVSS in another embodiment. The source of the third transistor M3 may be connected to the test voltage TM instead of the third node N3.

Another embodiment where the fourth and fifth transistors are switched with one signal will be illustrated with reference to drawings.

Figure 17:
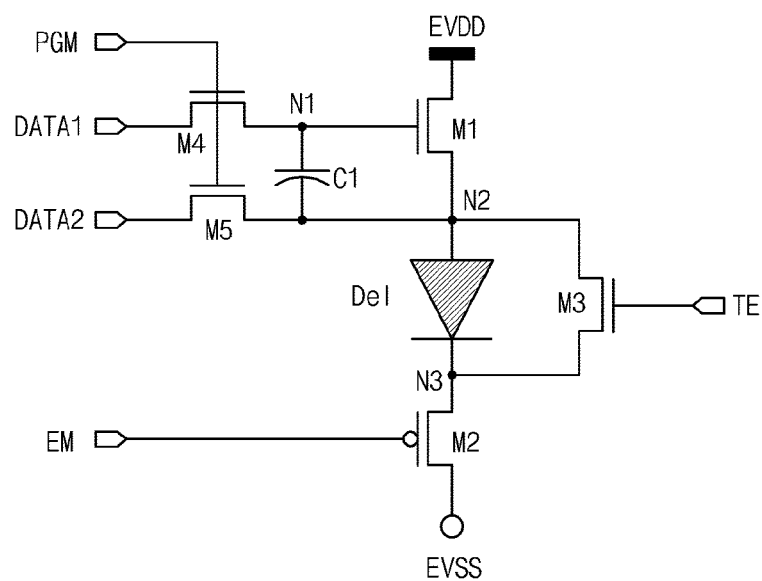
FIG. 17 is a view showing an emission part of a pixel of a light emitting diode display device according to an eighth embodiment of the present disclosure.
Figure 18:
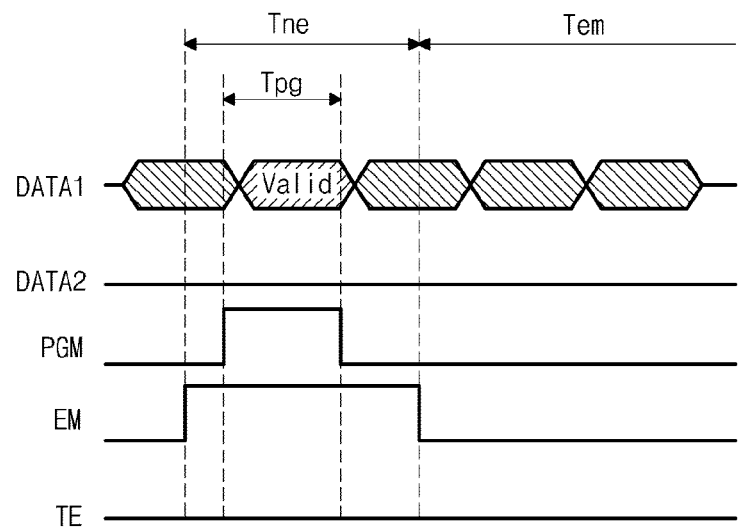
FIG. 18 is a view showing signals used in an emission part of a pixel of a light emitting diode display device according to an eighth embodiment of the present disclosure.

FIG. 17 is a view showing an emission part of a pixel of a light emitting diode display device according to an eighth embodiment of the present disclosure, and FIG. 18 is a view showing signals used in an emission part of a pixel of a light emitting diode display device according to an eighth embodiment of the present disclosure. Illustration on a part the same as a part of the first to seventh embodiments will be omitted.

In FIG. 17, the emission part of the pixel P of the light emitting diode display device according to an eighth embodiment of the present disclosure includes the first, third, fourth and fifth transistors M1, M3, M4 and M5 of a negative (N) type, the second transistor of a positive (P) type, the first capacitor C1 and the light emitting diode Del.

The first transistor M1 functioning as a current source for a constant current flowing through the light emitting diode Del switches a connection between the emission high level voltage EVDD and the light emitting diode Del according to the voltage of the first node N1, and the second transistor M2 functioning as a current source for a constant current flowing through the light emitting diode Del switches a connection between the light emitting diode Del and the emission low level voltage EVSS according to the voltage of the third node N3. The third transistor M3 switches a connection between the anode and the cathode of the light emitting diode Del according to the test signal TE.

The fourth transistor M4 of the control circuit part supplying the control signal to the current source switches a connection between a first data signal DATA1 and the first node N1 according to the programming signal PGM, and the fifth transistor M5 of the control circuit part supplying the control signal to the current source switches a connection between a second data signal DATA2 and the second node N2 according to the programming signal PGM.

The first transistor M1 has a negative (N) type, and a gate of the first transistor M1 is connected to the first node N1. A drain of the first transistor M1 is connected to the emission high level voltage EVDD, and a source of the first transistor M1 is connected to the second node N2.

The second transistor M2 has a positive (P) type, and a gate of the second transistor M2 is connected to the emission signal EM. A source of the second transistor M2 is connected to the third node N3, and a drain of the second transistor M2 is connected to the emission low level voltage EVSS.

The third transistor M3 has a negative (N) type, and a gate of the third transistor M3 is connected to the test signal TE.

A drain of the third transistor M3 is connected to the second node N2, and a source of the third transistor M3 is connected to the third node N3.

The fourth transistor M4 has a negative (N) type, and a gate of the fourth transistor M4 is connected to the programming signal PGM. A drain of the fourth transistor M4 is connected to the first data signal DATA1, and a source of the fourth transistor M4 is connected to the first node N1.

The fifth transistor M5 has a negative (N) type, and a gate of the fifth transistor M5 is connected to the programming signal PGM. A drain of the fifth transistor M5 is connected to the second data signal DATA2, and a source of the fifth transistor M5 is connected to the second node N2.

The first and second electrodes of the first capacitor C1 of the control circuit part supplying the control signal to the current source are connected to the first and second nodes N1 and N2, respectively.

The anode and the cathode of the light emitting diode Del are connected to the second and third nodes N2 and N3, respectively.

The gate of the first transistor M1, the source of the fourth transistor M4 and the first electrode of the first capacitor C1 constitute the first node N1, the source of the first transistor M1, the drain of the third transistor M3, the source of the fifth transistor M5, the second electrode of the first capacitor C1 and the anode of the light emitting diode Del constitute the second node N2, and the source of the second transistor M2, the source of the third transistor M3 and the cathode of the light emitting diode Del constitute the third node N3.

The light emitting diode display device according to an eighth embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, a defect of the first to fifth transistors M1 to M5 is detected using the first and second data signals DATA1 and DATA2, the programming signal PGM and the emission signal EM.

Here, before the light emitting diode Del is connected between the second and third nodes N2 and N3 in a fabrication process, it may be detected by turning on the third transistor M3 whether the other elements except for the light emitting diode Del normally operate or not.

After the light emitting diode Del is connected between the second and third nodes N2 and N3 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

In FIG. 18, the first data signal DATA1 has the valid period in each frame, and the second data signal DATA2 has a low level. The emission signal EM has a high level during the non-emission period Tne corresponding to the valid period of the present frame of the first data signal DATA1 and has a low level during the emission period Tem except for the non-emission period Tne. The programming signal PGM has a high level during the programming period Tpg corresponding to the valid period of the present frame of the first data signal DATA1.

During the non-emission period Tne, the second transistor M2 is turned off, and the light emitting diode Del does not emit a light.

During the programming period Tpg, the fourth and fifth transistors M4 and M5 are turned on, and the first and second data signals DATA1 and DATA2 are transmitted to the first and second nodes N1 and N2, respectively. As a result, a voltage difference between the first and second data signals DATA1 and DATA2 is stored in the first capacitor C1.

During the emission period Tem, the first transistor M1 is turned on by the voltage difference between the first and second data signals DATA1 and DATA2 of the first capacitor C1 to function as a current source supplying a constant current, and the second transistor M2 is turned on to function as a source follower where a constant current flows. As a result, the light emitting diode Del emits a light of a constant luminance due to a constant current regardless of a change of the emission high level voltage EVDD and the emission low level voltage EVSS.

In the light emitting diode display device according to an eighth embodiment of the present disclosure, the first and second transistors M1 and M2 are connected to the anode and the cathode, respectively, of the light emitting diode Del, and the first and second transistors M1 and M2 function as a current source and a source follower, respectively, using the fourth and fifth transistors M4 and M5. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode and the cathode of the light emitting diode Del and the third transistor M3 is turned on, a defect of a fabrication process may be detected to be repaired and a fabrication cost may be reduced.

Although the second transistor M2 is connected between the cathode of the light emitting diode Del and the emission low level voltage EVSS in an eighth embodiment of FIG. 17, the second transistor M2 may be omitted and the cathode of the light emitting diode Del may be directly connected to the emission low level voltage EVSS in another embodiment. The source of the third transistor M3 may be connected to the test voltage TM instead of the third node N3.

Another embodiment where the voltage of the second electrode of the first capacitor is fixed will be illustrated with reference to drawings.

Figure 19:
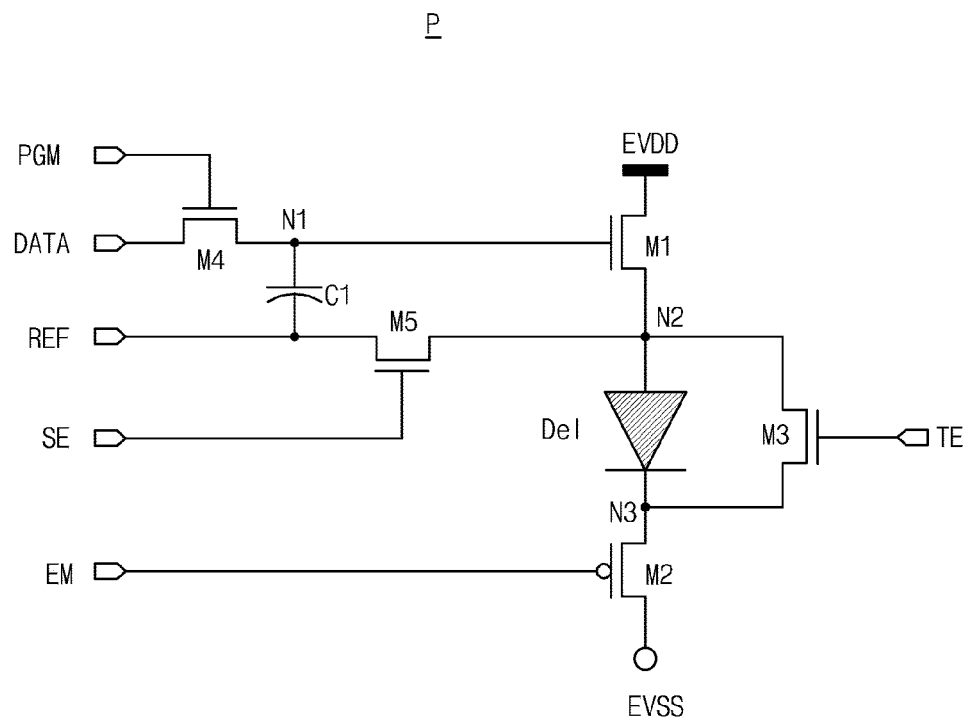
FIG. 19 is a view showing an emission part of a pixel of a light emitting diode display device according to a ninth embodiment of the present disclosure.
Figure 20:
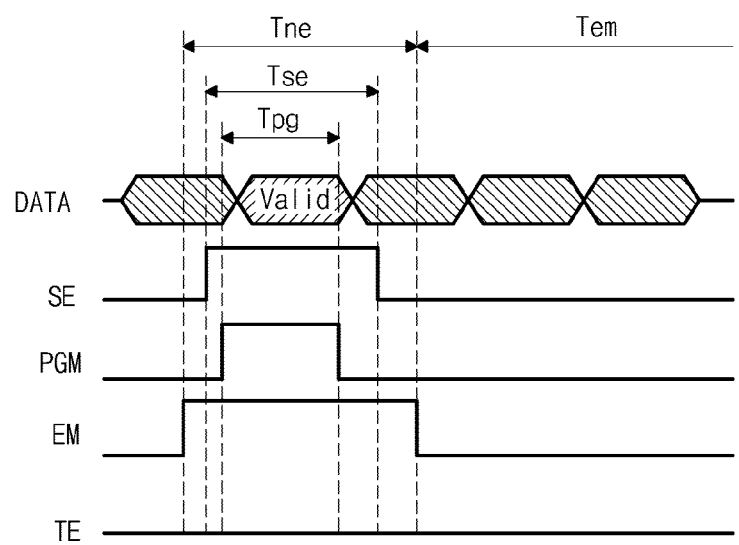
FIG. 20 is a view showing signals used in an emission part of a pixel of a light emitting diode display device according to a ninth embodiment of the present disclosure.

FIG. 19 is a view showing an emission part of a pixel of a light emitting diode display device according to a ninth embodiment of the present disclosure, and FIG. 20 is a view showing signals used in an emission part of a pixel of a light emitting diode display device according to a ninth embodiment of the present disclosure. Illustration on a part the same as a part of the first to eighth embodiments will be omitted.

In FIG. 19, the emission part of the pixel P of the light emitting diode display device according to a ninth embodiment of the present disclosure includes the first, third, fourth and fifth transistors M1, M3, M4 and M5 of a negative (N) type, the second transistor of a positive (P) type, the first capacitor C1 and the light emitting diode Del.

The first transistor M1 functioning as a current source for a constant current flowing through the light emitting diode Del switches a connection between the emission high level voltage EVDD and the light emitting diode Del according to the voltage of the first node N1, and the second transistor M2 functioning as a current source for a constant current flowing through the light emitting diode Del switches a connection between the light emitting diode Del and the emission low level voltage EVSS according to the voltage of the third node N3. The third transistor M3 switches a connection between the anode and the cathode of the light emitting diode Del according to the test signal TE.

The fourth transistor M4 of the control circuit part supplying the control signal to the current source switches a connection between the data signal DATA and the first node N1 according to the programming signal PGM, and the fifth transistor M5 of the control circuit part supplying the control signal to the current source switches a connection between a reference signal REF and the second node N2 according to a sense signal SE.

The first transistor M1 has a negative (N) type, and a gate of the first transistor M1 is connected to the first node N1. A drain of the first transistor M1 is connected to the emission high level voltage EVDD, and a source of the first transistor M1 is connected to the second node N2.

The second transistor M2 has a positive (P) type, and a gate of the second transistor M2 is connected to the emission signal EM. A source of the second transistor M2 is connected to the third node N3, and a drain of the second transistor M2 is connected to the emission low level voltage EVSS.

The third transistor M3 has a negative (N) type, and a gate of the third transistor M3 is connected to the test signal TE. A drain of the third transistor M3 is connected to the second node N2, and a source of the third transistor M3 is connected to the third node N3.

The fourth transistor M4 has a negative (N) type, and a gate of the fourth transistor M4 is connected to the programming signal PGM. A drain of the fourth transistor M4 is connected to the data signal DATA, and a source of the fourth transistor M4 is connected to the first node N1.

The fifth transistor M5 has a negative (N) type, and a gate of the fifth transistor M5 is connected to the sense signal SE. A drain of the fifth transistor M5 is connected to the reference signal REF and the second electrode of the first capacitor C1, and a source of the fifth transistor M5 is connected to the second node N2.

The first electrode of the first capacitor C1 of the control circuit part supplying the control signal to the current source is connected to the first node N1, and the second electrode of the first capacitor C1 is connected to the reference signal REF and the drain of the fifth transistor M5.

The anode and the cathode of the light emitting diode Del are connected to the second and third nodes N2 and N3, respectively.

The gate of the first transistor M1, the source of the fourth transistor M4 and the first electrode of the first capacitor C1 constitute the first node N1, the source of the first transistor M1, the drain of the third transistor M3, the source of the fifth transistor M5 and the anode of the light emitting diode Del constitute the second node N2, and the source of the second transistor M2, the source of the third transistor M3 and the cathode of the light emitting diode Del constitute the third node N3.

The light emitting diode display device according to a ninth embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, a defect of the first to fifth transistors M1 to M5 is detected using the data signal DATA, the sense signal SE, the programming signal PGM and the emission signal EM.

Here, before the light emitting diode Del is connected between the second and third nodes N2 and N3 in a fabrication process, it may be detected by turning on the third transistor M3 whether the other elements except for the light emitting diode Del normally operate or not.

After the light emitting diode Del is connected between the second and third nodes N2 and N3 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

In FIG. 20, the data signal DATA has the valid period in each frame, and the emission signal EM has a high level during the non-emission period Tne corresponding to the valid period of the present frame of the data signal DATA and has a low level during the emission period Tem except for the non-emission period Tnc. The programming signal PGM has a high level during the programming period Tpg corresponding to the valid period of the present frame of the data signal DATA2, and the sense signal SE has a high level during a sense period Tse corresponding to the valid period of the present frame of the data signal DATA.

During the non-emission period Tne, the second transistor M2 is turned off, and the light emitting diode Del does not emit a light.

During the programming period Tpg, the fourth transistor M4 are turned on, the data signal DATA is transmitted to the first node N1, and a voltage of the second electrode of the first capacitor C1 is maintained as the reference signal REF. As a result, a voltage difference between the data signal DATA and the reference signal REF is stored in the first capacitor C1.

During the sense period Tse, the fifth transistor M5 is turned on, and the reference signal REF is transmitted to the second node N2. As a result, the anode of the light emitting diode Del is initialized, and a property such as a moving picture response time (MPRT) is improved.

During the emission period Tem, the first transistor M1 is turned on by the data signal DATA of the first capacitor C1 to function as a source follower where a constant current flows, and the second transistor M2 is turned on to function as a source follower where a constant current flows. As a result, the light emitting diode Del emits a light of a constant luminance due to a constant current regardless of a change of the emission high level voltage EVDD and the emission low level voltage EVSS.

Here, a current of the light emitting diode Del is determined by the voltage difference of the first and second transistors M1 and M2 functioning as a source follower. When the pixel P includes the light emitting diode Del emitting a red colored light, a green colored light and a blue colored light, a current reflecting an operation property difference of red, green and blue light emitting diodes Del may flow through the light emitting diode Del by adjusting an aspect ratio of the first and second transistors M1 and M2.

In the light emitting diode display device according to a ninth embodiment of the present disclosure, the first and second transistors M1 and M2 are connected to the anode and the cathode, respectively, of the light emitting diode Del, and the first and second transistors M1 and M2 function as a source follower using the fourth and fifth transistors M4 and M5. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode and the cathode of the light emitting diode Del and the third transistor M3 is turned on, a defect of a fabrication process may be detected to be repaired and a fabrication cost may be reduced.

Although the second transistor M2 is connected between the cathode of the light emitting diode Del and the emission low level voltage EVSS in a ninth embodiment of FIG. 19, the second transistor M2 may be omitted and the cathode of the light emitting diode Del may be directly connected to the emission low level voltage EVSS in another embodiment. The source of the third transistor M3 may be connected to the test voltage TM instead of the third node N3.

Another embodiment where each pixel includes the latch and the emission part will be illustrated with reference to drawings.

Figure 21:
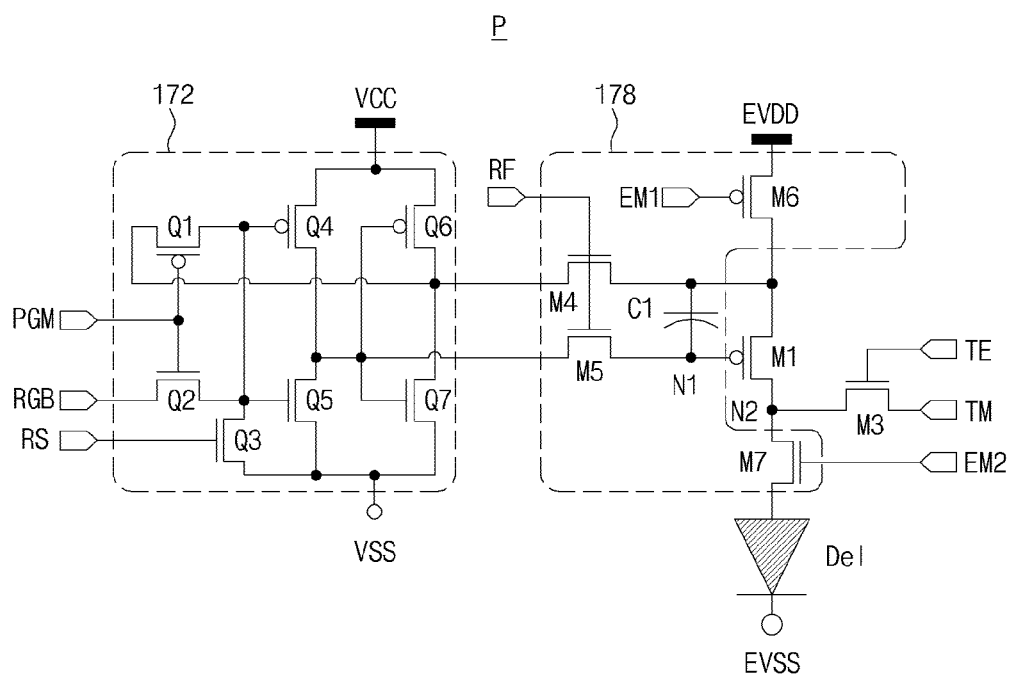
FIG. 21 is a view showing a pixel of a light emitting diode display device according to a tenth embodiment of the present disclosure.
Figure 22:
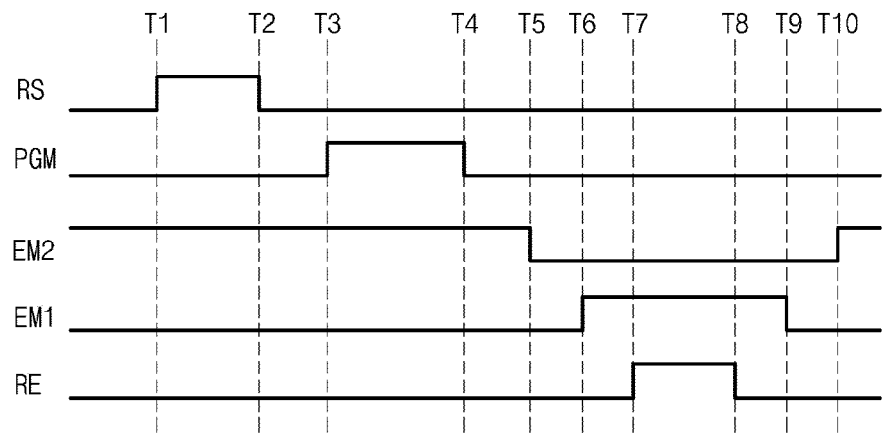
FIG. 22 is a view showing signals used for a pixel of a light emitting diode display device according to a tenth embodiment of the present disclosure.

FIG. 21 is a view showing a pixel of a light emitting diode display device according to a tenth embodiment of the present disclosure, and FIG. 22 is a view showing signals used for a pixel of a light emitting diode display device according to a tenth embodiment of the present disclosure. Illustration on a part the same as a part of the first to ninth embodiments will be omitted.

In FIG. 21, the pixel P of the light emitting diode display device according to a tenth embodiment of the present disclosure includes the latch 172 and the emission part 178. The latch 172 includes the first to seventh digital transistors Q1 to Q7, and the emission part 178 includes the first, third, fourth, fifth, sixth and seventh transistors M1, M3, M4, M5, M6 and M7, the first capacitor C1 and the light emitting diode Del.

The latch 172, the fourth to seventh transistors M4 to M7 and the first capacitor C1 constitute the control circuit part supplying the control signal to the first transistor M1 of a current source. The first, fourth and sixth digital transistors Q1, Q4 and Q6 have a positive (P) type, and the second, third, fifth and seventh digital transistors Q2, Q3, Q5 and Q7 have a negative (N) type. The first and sixth transistors M1 and M6 have a positive (P) type, and the third, fourth, fifth and seventh transistors M3, M4, M5 and M7 have a negative (N) type.

The first digital transistor Q1 switches a connection between the first output signal and the gates of the fourth and fifth digital transistors Q4 and Q5 according to the programming signal PGM for inputting the image data RGB to the latch 172, and the second digital transistor Q2 switches a connection between the image data RGB and the gates of the fourth and fifth digital transistors Q4 and Q5 according to the programming signal PGM.

The third digital transistor Q3 switches a connection between the digital low level voltage VSS and the gates of the fourth and fifth digital transistors Q4 and Q5 according to the reset signal RS for resetting the latch 172.

In another embodiment, the reset signal RS and the third digital transistor Q3 may be omitted.

The fourth digital transistor Q4 switches a connection between the digital high level voltage VCC and the second output signal according to the first output signal or the digital low level voltage VSS, and the fifth digital transistor Q5 switches a connection between the digital low level voltage VSS and the second output signal according to the first output signal or the digital low level voltage VSS.

The sixth digital transistor Q6 switches a connection between the digital high level voltage VCC and the first output signal according to the second output signal, and the seventh digital transistor Q7 switches a connection between the digital low level voltage VSS and the second output signal according to the second output signal.

The first transistor M1 functioning as a current source for a constant current flowing through the light emitting diode Del switches a connection between the sixth and seventh transistors M6 and M7 according to the voltage of the first node N1, and the third transistor M3 switches a connection between the drain of the seventh transistor M7 and the test voltage TM according to the test signal TE.

The gate of the first transistor M1 is connected to the second electrode of the first capacitor C1 and the fifth transistor M5 to constitute the first node N1, the source of the first transistor M1 is connected to the first electrode of the first capacitor C1 and the sixth transistor M6, and the drain of the first transistor M1 is connected to the third and seventh transistors M3 and M7 to constitute the second node N2.

The fourth transistor M4 switches a connection between the first output signal and the first electrode of the first capacitor C1 according to the reference signal RF, and the fifth transistor M5 switches a connection between the second output signal and the first node N1 according to the reference signal RF.

The sixth transistor M6 switches a connection between the emission high level voltage EVDD and the first transistor M1 according to a first emission signal EM1, and the seventh transistor M7 switches a connection between the first transistor M1 and the light emitting diode Del according to a second emission signal EM2.

The first electrode of the first capacitor C1 is connected to the first, fourth and sixth transistors M1, M4 and M6, and the second electrode of the first capacitor C1 is connected to the first node N1.

The anode of the light emitting diode Del is connected to the seventh transistor M7, and the cathode of the light emitting diode Del is connected to the emission low level voltage EVSS.

The light emitting diode display device according to a tenth embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, the second node N2 is initialized with the test voltage TM to prevent reduction lower than a predetermined voltage, or a property of the first transistor M1 or the light emitting diode Del is detected.

Here, before the light emitting diode Del is connected to the second node N2 in a fabrication process, it may be detected by turning on the third transistor M3 whether the other elements except for the light emitting diode Del normally operate or not.

After the light emitting diode Del is connected to the second node N2 in a fabrication process, it may be detected by turning on the third transistor M3 such that a voltage difference between the second node N2 and the source of the seventh transistor M7 is smaller than an emission threshold voltage of the light emitting diode Del whether the other elements except for the light emitting diode Del normally operate or not.

In FIG. 22, during a period between first and second timings T1 and T2, since the third digital transistor Q3 is turned on according to the reset signal RS of a high level, the gates of the fourth and fifth digital transistors Q4 and Q5 are reset with the digital low level voltage VSS.

During a period between third and fourth timings T3 and T4, since the image data RGB is inputted to the latch 172 according to the programming signal PGM of a high level, the first and second output signals are outputted from the latch 172.

The seventh transistor M7 is turned off according to the second emission signal EM2 of a low level during a period between fifth and tenth timings T5 and T10, and the sixth transistor M6 is turned off according to the first emission signal EM1 of a high level during a period between sixth and ninth timings T6 and T9. As a result, the light emitting diode Del has a non-emission state.

During a period between seventh and eighth timings T7 and T8, since the fourth and fifth transistors M4 and M5 are turned on according to the reference signal RF of a high level, the first and second output signals of the latch 172 are transmitted to the source and gate, respectively, of the first transistor M1.

During a period between ninth and tenth timings T9 and T10, since the sixth and seventh transistors M6 and M7 are turned on, the light emitting diode Del has an emission state. As a result, the first transistor M1 is turned on due to the second output signal of the first capacitor C1 to function as a source follower where a constant current flows, and the light emitting diode Del emits a light of a constant luminance due to a constant current regardless of a change of the emission high level voltage EVDD and the emission low level voltage EVSS.

Here, a current of the light emitting diode Del is determined by the voltage difference between the first transistor M1 functioning as a source follower and the emission low level voltage EVSS. When the pixel P includes the light emitting diode Del emitting a red colored light, a green colored light and a blue colored light, a current reflecting an operation property difference of red, green and blue light emitting diodes Del may flow through the light emitting diode Del by adjusting an aspect ratio of the first transistor M1.

In the light emitting diode display device according to a tenth embodiment of the present disclosure, the first transistor M1 is connected to the anode of the light emitting diode Del, and the first transistor M1 functions as a source follower using the fourth and fifth transistors M4 and M5. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode of the light emitting diode Del and the third transistor M3 is turned on, a defect of a fabrication process may be detected to be repaired and a fabrication cost may be reduced.

Another embodiment where the first transistor M1 of a negative (N) type is connected to the fourth transistor M4 will be illustrated with reference to a drawing.

Figure 23:
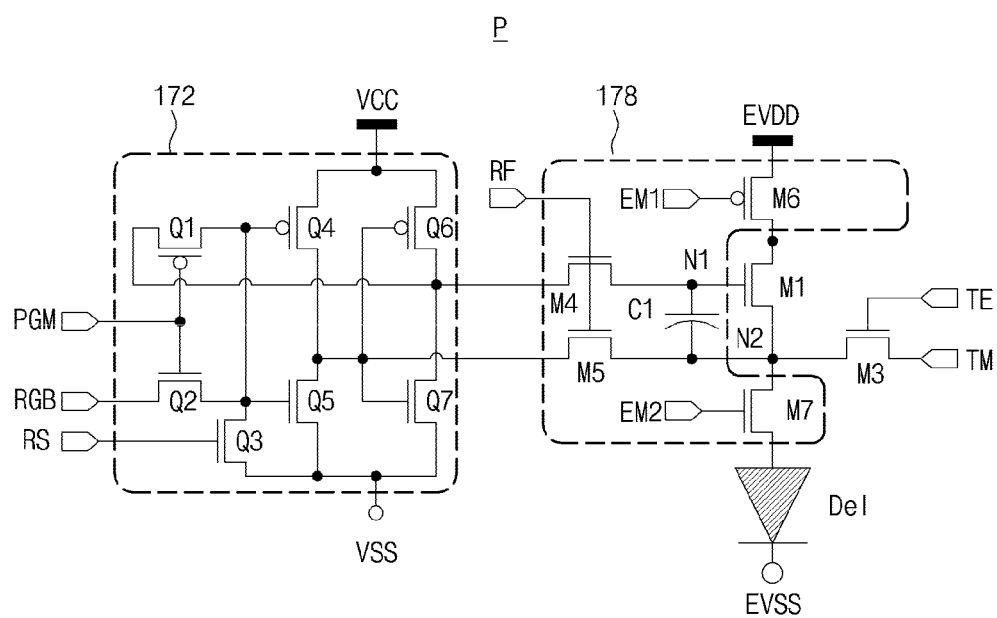
FIG. 23 is a view showing a pixel of a light emitting diode display device according to an eleventh embodiment of the present disclosure.

FIG. 23 is a view showing a pixel of a light emitting diode display device according to an eleventh embodiment of the present disclosure. Illustration on a part same as a part of the first to tenth embodiments will be omitted.

In FIG. 23, the pixel P of the light emitting diode display device according to an eleventh embodiment of the present disclosure includes the latch 172 and the emission part 178. The latch 172 includes the first to seventh digital transistors Q1 to Q7, and the emission part 178 includes the first, third, fourth, fifth, sixth and seventh transistors M1, M3, M4, M5, M6 and M7, the first capacitor C1 and the light emitting diode Del.

The latch 172, the fourth to seventh transistors M4 to M7 and the first capacitor C1 constitute the control circuit part supplying the control signal to a current source. The first, fourth and sixth digital transistors Q1, Q4 and Q6 have a positive (P) type, and the second, third, fifth and seventh digital transistors Q2, Q3, Q5 and Q7 have a negative (N) type. A structure and an operation of the latch 172 of each pixel P of the light emitting diode display device according to an eleventh embodiment are the same as a structure and an operation of the light emitting diode display device according to a tenth embodiment.

The sixth transistor M1 has a positive (P) type, and the first, third, fourth, fifth and seventh transistors M1, M3, M4, M5 and M7 have a negative (N) type.

The first transistor M1 functioning as a current source for a constant current flowing through the light emitting diode Del switches a connection between the sixth and seventh transistors M6 and M7 according to the voltage of the first node N1, and the third transistor M3 switches a connection between the drain of the seventh transistor M7 and the test voltage TM according to the test signal TE.

The gate of the first transistor M1 is connected to the first electrode of the first capacitor C1 and the fourth transistor M4 to constitute the first node N1, the drain of the first transistor M1 is connected to the sixth transistor M6, and the source of the first transistor M1 is connected to the second electrode of the first capacitor C1, the third, fifth and seventh transistors M3, M5 and M7 to constitute the second node N2.

The fourth transistor M4 switches a connection between the first output signal and the first node N1 according to the reference signal RF, and the fifth transistor M5 switches a connection between the second output signal and the second node N2 according to the reference signal RF.

The sixth transistor M6 switches a connection between the emission high level voltage EVDD and the first transistor M1 according to the first emission signal EM1, and the seventh transistor M7 switches a connection between the first transistor M1 and the light emitting diode Del according to the second emission signal EM2.

The first electrode of the first capacitor C1 is connected to the first node N1, and the second electrode of the first capacitor C1 is connected to the second node N2.

The anode of the light emitting diode Del is connected to the seventh transistor M7, and the cathode of the light emitting diode Del is connected to the emission low level voltage EVSS.

The light emitting diode display device according to a eleventh embodiment of the present disclosure may operate in a display mode and a test mode.

In the display mode, the third transistor M3 is turned off, and the light emitting diode Del emits a light. As a result, the light emitting diode display device displays an image.

In the test mode, the third transistor M3 is turned on, and the light emitting diode Del does not emit a light. Further, the second node N2 is initialized with the test voltage TM to prevent reduction lower than a predetermined voltage, or a property of the first transistor M1 or the light emitting diode Del is detected.

Here, before the light emitting diode Del is connected to the second node N2 in a fabrication process, it may be detected by turning on the third transistor M3 whether the other elements except for the light emitting diode Del normally operate or not.

After the light emitting diode Del is connected to the second node N2 in a fabrication process, it may be detected by turning on the third transistor M3 such that a voltage difference between the second and third nodes N2 and N3 is smaller than an emission threshold voltage of the light emitting diode Del whether the other elements except for the light emitting diode Del normally operate or not.

The light emitting diode display device according to an eleventh embodiment of the present disclosure may operate using the signals of FIG. 22.

In the light emitting diode display device according to an eleventh embodiment of the present disclosure, the first transistor M1 is connected to the anode of the light emitting diode Del, and the first transistor M1 functions as a source follower using the fourth and fifth transistors M4 and M5. As a result, a constant current may flow through the light emitting diode Del regardless of a change of the emission high level voltage EVDD and the emission low level voltage EVSS, and a uniformity of an emission luminance is improved.

Further, since the third transistor M3 is connected to the anode of the light emitting diode Del and the third transistor M3 is turned on, a defect of a fabrication process may be detected to be repaired and a fabrication cost may be reduced.

Another embodiment where the current source is connected to the anode or the cathode of the light emitting diode will be illustrated with reference to drawings.

Figure 24:
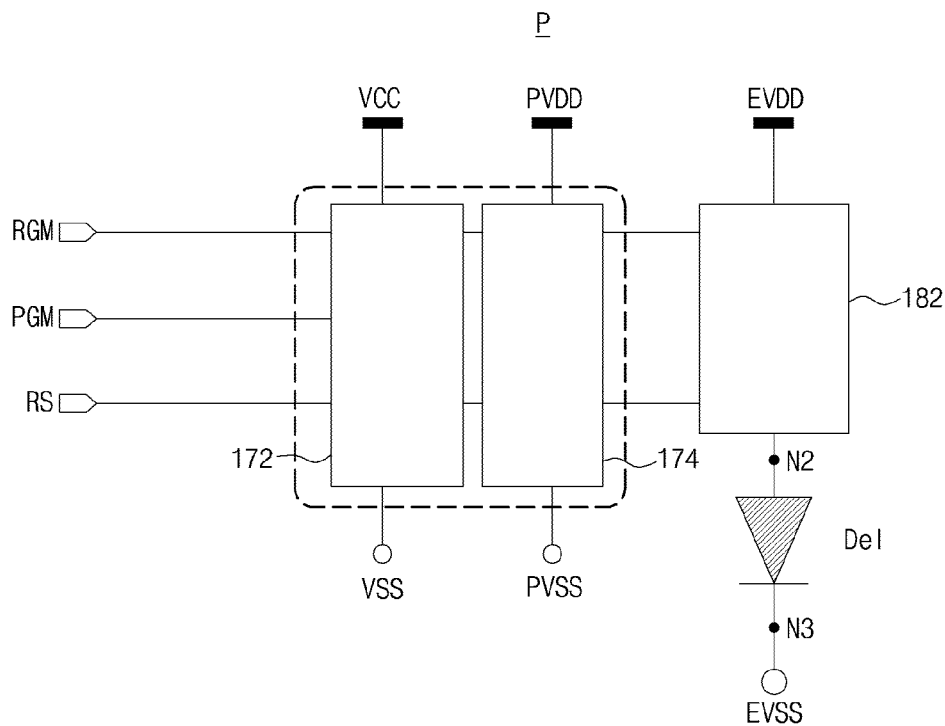
FIG. 24 is a view showing a pixel of a light emitting diode display device according to a twelfth embodiment of the present disclosure.
Figure 25:
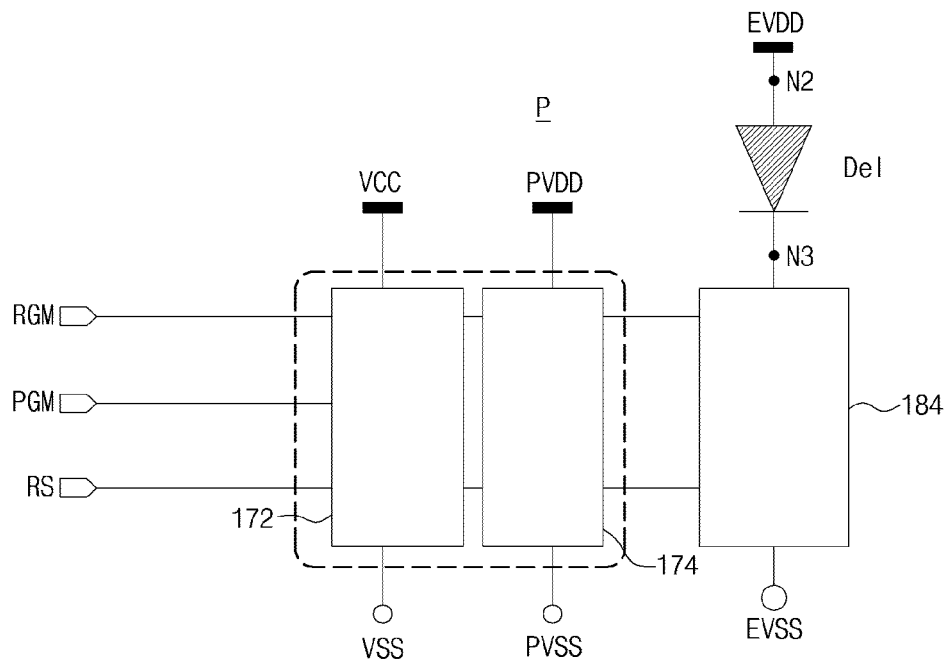
FIG. 25 is a view showing a pixel of a light emitting diode display device according to a thirteenth embodiment of the present disclosure.

FIGS. 24 and 25 are views showing a pixel of a light emitting diode display device according to twelfth and thirteenth embodiments, respectively, of the present disclosure. Illustration on a part the same as a part of the first to eleventh embodiments will be omitted.

In FIG. 24, the pixel P of the light emitting diode display device according to a twelfth embodiment of the present disclosure includes the latch 172, the level shifter 174, a current source 182 and the light emitting diode Del. The latch 172 and the level shifter 174 constitute the control circuit part supplying the control signal to the current source 182, and the current source 182 and the light emitting diode Del constitute the emission part.

The latch 172 receives the image data RGB, the programming signal PGM and the reset signal RS and outputs the first and second output signals using the digital high level voltage VCC and the digital low level voltage VSS. The first and second output signals may be inverted signals to each other.

In another embodiment, the reset signal RS may be omitted.

The level shifter 174 receives the first and second output signals and outputs the third and fourth output signals using the pin high level voltage PVDD and the pin low level voltage PVSS. The third and fourth output signals may be inverted signals to each other.

The current source 182 connected to the anode of the light emitting diode Del receives at least one of the third and fourth output signals, and a constant current flows through the light emitting diode Del due to the current source 182 using the at least one of the third and fourth output signals.

For example, the latch 172 and the level shifter 174 may include a plurality of transistors, and the current source 182 may include a transistor and a capacitor.

When the level shifter 174 outputs the third and fourth output signals using the first and second output signals of the latch 172 of a digital storage element, the DC by pass current in the level shifter 174 may be prevented. As a result, the light emitting diode Del may emit a light of a constant luminance.

Here, the image data RGB inputted to the latch 172 has a digital type of a digital voltage level.

In FIG. 25, the pixel P of the light emitting diode display device according to a thirteenth embodiment of the present disclosure includes the latch 172, the level shifter 174, a current source 184 and the light emitting diode Del. The latch 172 and the level shifter 174 constitute the control circuit part supplying the control signal to the current source 184, and the current source 184 and the light emitting diode Del constitute the emission part.

The latch 172 receives the image data RGB, the programming signal PGM and the reset signal RS and outputs the first and second output signals using the digital high level voltage VCC and the digital low level voltage VSS. The first and second output signals may be inverted signals to each other.

In another embodiment, the reset signal RS may be omitted.

The level shifter 174 receives the first and second output signals and outputs the third and fourth output signals using the pin high level voltage PVDD and the pin low level voltage PVSS. The third and fourth output signals may be inverted signals to each other.

The current source 184 connected to the cathode of the light emitting diode Del receives at least one of the third and fourth output signals, and a constant current flows through the light emitting diode Del due to the current source 184 using the at least one of the third and fourth output signals.

For example, the latch 172 and the level shifter 174 may include a plurality of transistors, and the current source 184 may include a transistor and a capacitor.

When the level shifter 174 outputs the third and fourth output signals using the first and second output signals of the latch 172 of a digital storage element, the DC by pass current in the level shifter 174 may be prevented. As a result, the light emitting diode Del may emit a light of a constant luminance.

Here, the image data RGB inputted to the latch 172 has a digital type of a digital voltage level.

In the pixel P of the light emitting diode display device according to twelfth and thirteenth embodiments of the present disclosure, the latch 172 outputs the first and second output signals of a constant direct current (DC) voltage level for preventing a flicker, etc., and the level shifter 174 applies at least one of the third and fourth output signals necessary for an emission to the current source 182 and 184. As a result, a constant current may flow through the light emitting diode Del regardless of a change of the emission high level voltage EVDD and the emission low level voltage EVSS.

Another embodiment where the output signal of the level shifter is stored in the latch and then is supplied to the current source will be illustrated with reference to drawings.

Figure 26:
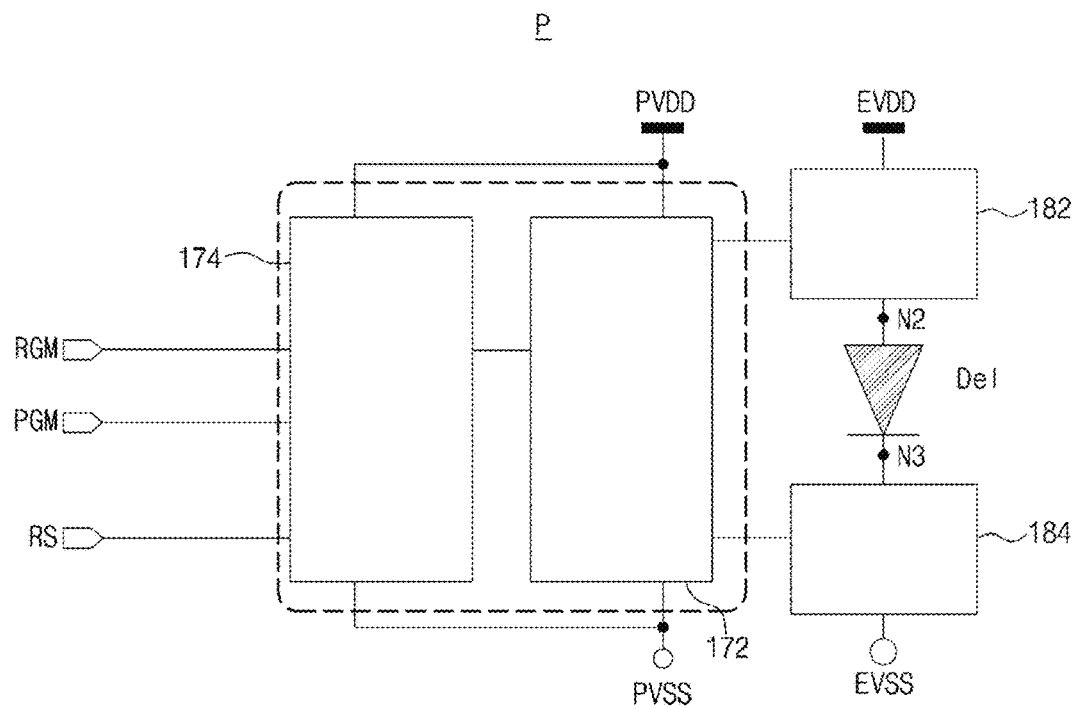
FIG. 26 is a view showing a pixel of a light emitting diode display device according to a fourteenth embodiment of the present disclosure.
Figure 27:
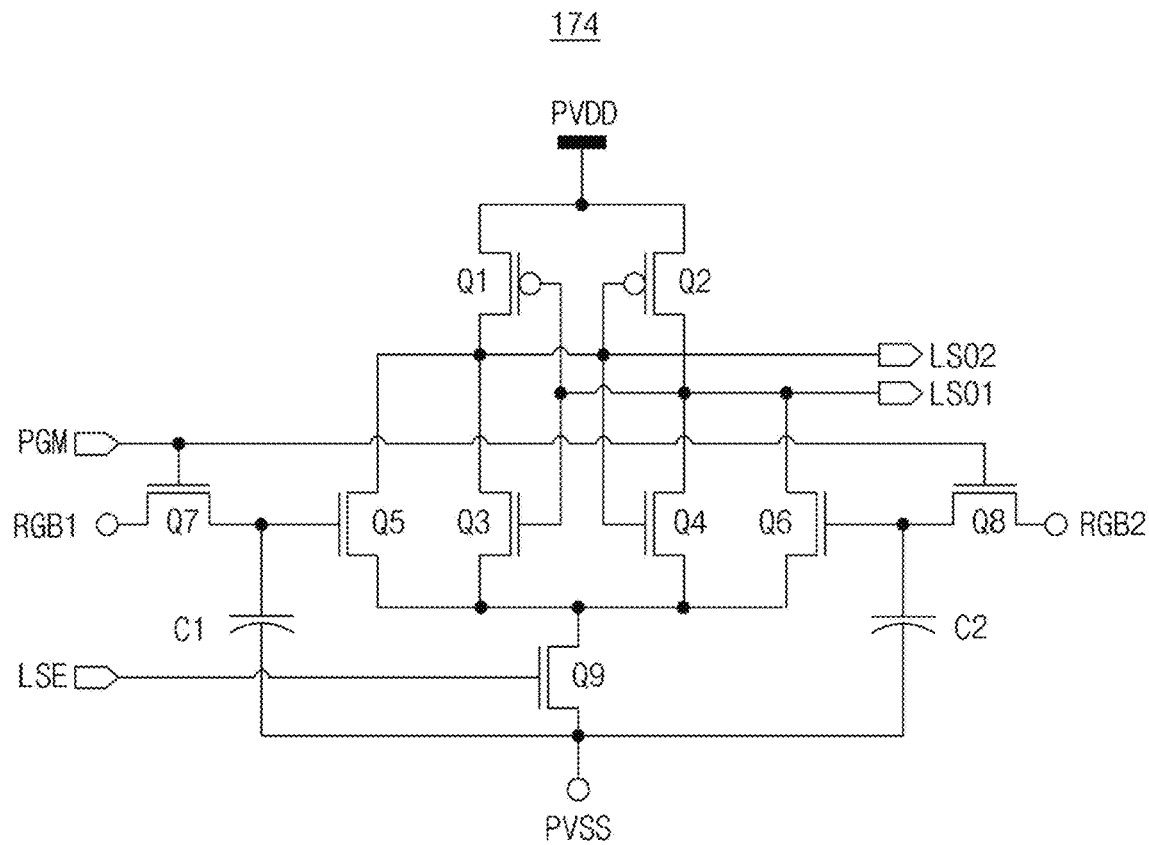
FIG. 27 is a view showing a level shifter of a pixel of a light emitting diode display device according to a fourteenth embodiment of the present disclosure.
Figure 28:
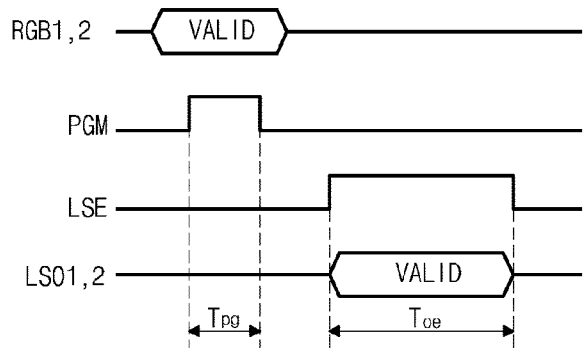
FIG. 28 is a view showing signals used for a level shifter of a pixel of a light emitting diode display device according to a fourteenth embodiment of the present disclosure.

FIG. 26 is a view showing a pixel of a light emitting diode display device according to a fourteenth embodiment of the present disclosure, FIG. 27 is a view showing a level shifter of a pixel of a light emitting diode display device according to a fourteenth embodiment of the present disclosure, and FIG. 28 is a view showing signals used for a level shifter of a pixel of a light emitting diode display device according to a fourteenth embodiment of the present disclosure. Illustration on a part the same as a part of the first to thirteenth embodiments will be omitted.

In FIG. 26, the pixel P of the light emitting diode display device according to a fourteenth embodiment of the present disclosure includes the level shifter 174, the latch 172, the first and second current sources 182 and 184 and the light emitting diode Del. The level shifter 174 and the latch 172 constitute the control circuit part supplying the control signal to the first and second current sources 182 and 184, and the first and second current sources 182 and 184 and the light emitting diode Del constitute the emission part.

The level shifter 174 receives the image data RGB, the programming signal PGM and the reset signal RS and outputs at least one of the first and second output signals using the pin high level voltage PVDD and the pin low level voltage PVSS. The first and second output signals may be inverted signals to each other.

In another embodiment, the reset signal RS may be omitted.

The latch 172 receives at least one of the first and second output signals and outputs at least one of the third and fourth output signals using the pin high level voltage PVDD and the pin low level voltage PVSS. The third and fourth output signals may be inverted signals to each other.

The first current source 182 connected to the anode of the light emitting diode Del receives the third output signal, and a constant current flows through the light emitting diode Del due to the first current source 182 using the third output signal.

The second current source 184 connected to the cathode of the light emitting diode Del receives the fourth output signal, and a constant current flows through the light emitting diode Del due to the second current source 182 using the fourth output signal.

For example, the level shifter 174 and the latch 172 may include a plurality of transistors, and the first and second current sources 182 and 184 may include a transistor and a capacitor.

Here, the image data RGB inputted to the level shifter 174 has a digital type of a digital voltage level.

In FIG. 27, the level shifter 174 of the pixel P of the light emitting diode display device according to a fourteenth embodiment of the present disclosure includes first to ninth digital transistors Q1 to Q9 and first and second capacitors C1 and C2.

The first and second digital transistors Q1 and Q2 have a positive (P) type, and the third to ninth digital transistors Q3 to Q9 have a negative (N) type.

The first digital transistor Q1 switches a connection between the pin high level voltage PVDD and the drain of the third transistor Q3 according to a first output signal LSO1, and the second digital transistor Q2 switches a connection between the pin high level voltage PVDD and the drain of the fourth transistor Q4 according to a second output signal LSO2.

The third digital transistor Q3 switches a connection between the drain of the first digital transistor Q1 and the drain of the ninth transistor Q9 according to the first output signal LSO1, and the fourth digital transistor Q4 switches a connection between the drain of the second digital transistor Q2 and the drain of the ninth transistor Q9 according to the second output signal LSO2.

The fifth digital transistor Q5 switches a connection between the drain of the first digital transistor Q1 and the drain of the ninth transistor Q9 according to the voltage of the first electrode of the first capacitor C1, and the sixth digital transistor Q6 switches a connection between the drain of the second digital transistor Q2 and the drain of the ninth transistor Q9 according to the voltage of the first electrode of the second capacitor C2.

The seventh digital transistor Q7 switches a connection between a first image data RGB1 and the gate of the fifth transistor Q5 according to the programming signal PGM for inputting the first and second image data RGB1 and RGB2 to the level shifter 174, and the eighth digital transistor Q8 switches a connection between a second image data RGB2 and the gate of the sixth transistor Q6 according to the programming signal PGM.

The ninth digital transistor Q9 switches a connection between the sources of the third to sixth digital transistors Q3 to Q6 and the pin low level voltage PVSS according to an enable signal LSE for activating the output of the level shifter 174.

The first capacitor C1 is connected between the source of the seventh digital transistor Q7 and the low level voltage PVSS, and the second capacitor C2 is connected between the source of the eighth digital transistor Q8 and the pin low level voltage PVSS.

In FIG. 28, each of the first and second image data RGB1 and RGB2 has the valid period in each frame, the programming signal PGM has a high level during the programming period Tpg corresponding to the valid period of the present frame of the first and second image data RGB1 and RGB2, and the enable signal LSE has a high level during an output enable period Toc.

During the programming period Tpg, the seventh and eighth digital transistors Q7 and Q8 are turned on, and the first and second image data RGB1 and RGB2 are stored in the first and second capacitors C1 and C2, respectively. Next, during the output enable period Toc, the valid first and second output signals LSO1 and LSO2 are outputted from the first and second capacitors C1 and C2, respectively.

Although not shown, the latch 172 may store the first and second output signals LSO1 and LSO2 and then may supply the first and second output signals LSO1 and LSO2 to the light emitting diode Del at a predetermined timing.

Figure 29:
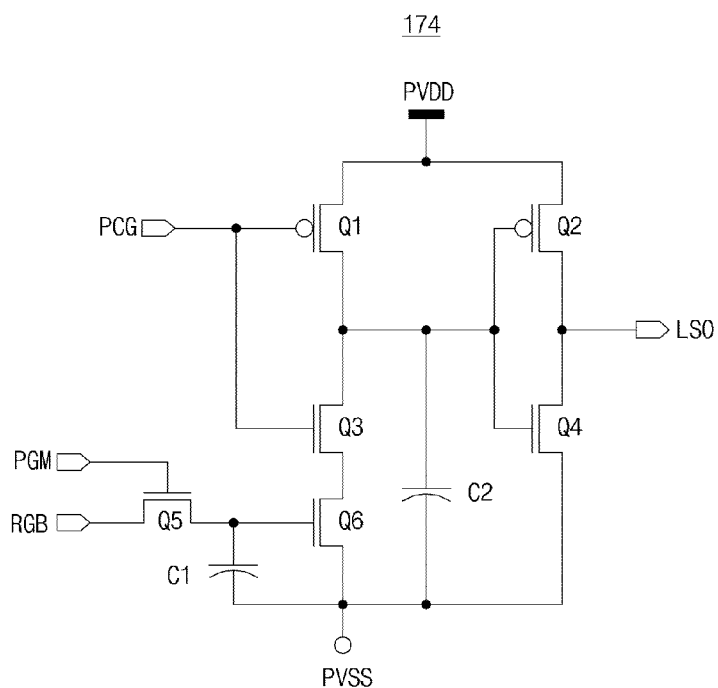
FIG. 29 is a view showing a level shifter of a pixel of a light emitting diode display device according to a fifteenth embodiment of the present disclosure.
Figure 30:
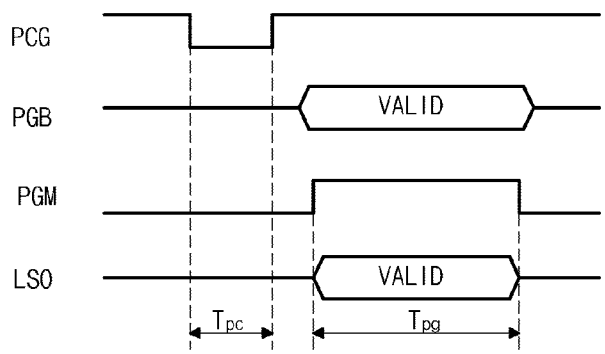
FIG. 30 is a view showing signals used for a level shifter of a pixel of a light emitting diode display device according to a fifteenth embodiment of the present disclosure.

FIG. 29 is a view showing a level shifter of a pixel of a light emitting diode display device according to a fifteenth embodiment of the present disclosure, and FIG. 30 is a view showing signals used for a level shifter of a pixel of a light emitting diode display device according to a fifteenth embodiment of the present disclosure. A structure of the pixel according to a fifteenth embodiment is the same as a structure of the pixel according to a fourteenth embodiment of FIG. 26.

In FIG. 29, the level shifter 174 of the pixel P of the light emitting diode display device according to a fifteenth embodiment of the present disclosure includes first to sixth digital transistors Q1 to Q6 and first and second capacitors C1 and C2.

The first and second digital transistors Q1 and Q2 have a positive (P) type, and the third to sixth digital transistors Q3 to Q6 have a negative (N) type.

The first digital transistor Q1 switches a connection between the pin high level voltage PVDD and the drain of the third transistor Q3 according to a precharge signal PCG, and the second digital transistor Q2 switches a connection between the pin high level voltage PVDD and the drain of the fourth transistor Q4 according to the voltage of the first electrode of the second capacitor C2.

The third digital transistor Q3 switches a connection between the drain of the first digital transistor Q1 and the drain of the sixth transistor Q6 according to the precharge signal PCG, and the fourth digital transistor Q4 switches a connection between the drain of the second digital transistor Q2 and the pin low level voltage PVSS according to the voltage of the first electrode of the second capacitor C2.

The fifth digital transistor Q5 switches a connection between the image data RGB and the gate of the sixth transistor Q6 according to the programming signal PGM, and the sixth digital transistor Q6 switches a connection between the source of the third digital transistor Q3 and the pin low level voltage PVSS according to the voltage of the first electrode of the first capacitor C1.

The first capacitor C1 is connected between the source of the fifth digital transistor Q5 and the low level voltage PVSS, and the second capacitor C2 is connected between the gate of the second digital transistor Q2 and the pin low level voltage PVSS.

An output signal LSO is outputted from a node between the drain of the second digital transistor Q2 and the drain of the fourth digital transistor Q4.

In FIG. 30, the image data RGB has the valid period in each frame, the precharge signal PCG has a low level during a precharge period Tpc prior to the valid period of the present frame of the image data RGB, and the programming signal PGM has a high level during the programming period Tpg corresponding to the valid period of the present frame of the image data RGB.

During the precharge period Tpc, the first digital transistor Q1 is turned on, and the pin high level voltage PVDD is stored in the second capacitor C2. During the programming period Tpg, the fifth digital transistor Q5 is turned on. As a result, the image data RGB is stored in the first capacitor C1, and the valid output signal LSO is outputted.

Although not shown, the latch 172 may store the output signal LSO and then may supply the output signal LSO to the light emitting diode Del at a predetermined timing.

In the light emitting diode display device according to fourteenth and fifteenth embodiments of the present disclosure, the level shifter 174 outputs one of the first and second output signals using the image data RGB, the programming signal PGM and the reset signal RS, and the latch 172 applies at least one of the third and fourth output signals necessary for an emission to the current source 182 and 184. As a result, a constant current may flow through the light emitting diode Del regardless of a change of the emission high level voltage EVDD and the emission low level voltage EVSS.

Another embodiment where the current source is connected to the anode or the cathode of the light emitting diode will be illustrated with reference to drawings.

Figure 31:
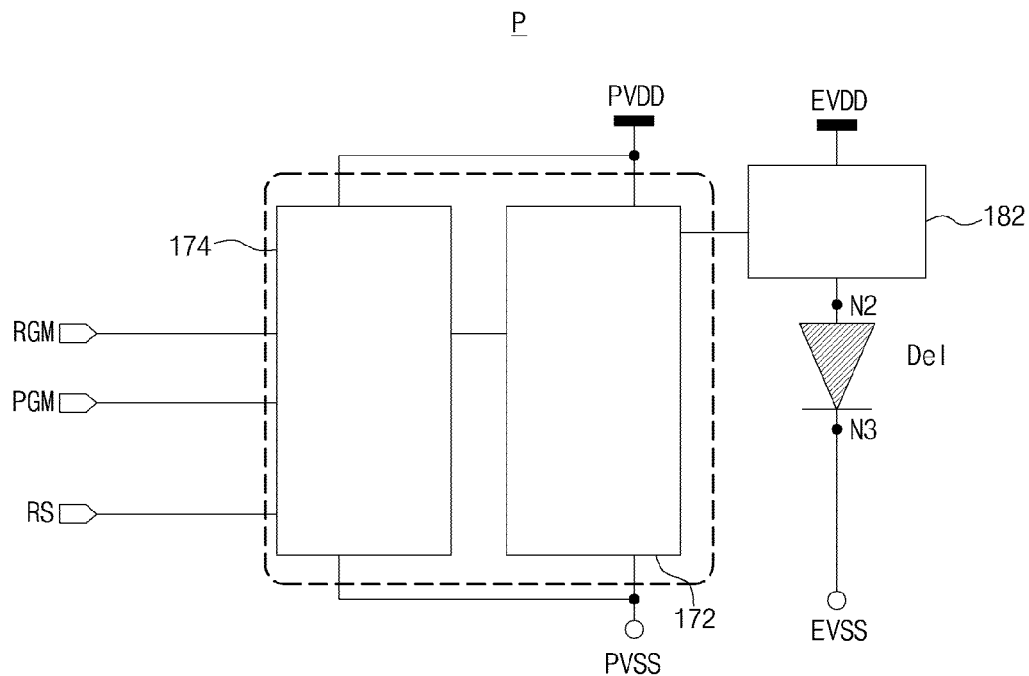
FIG. 31 is a view showing a pixel of a light emitting diode display device according to a sixteenth embodiment of the present disclosure.
Figure 32:
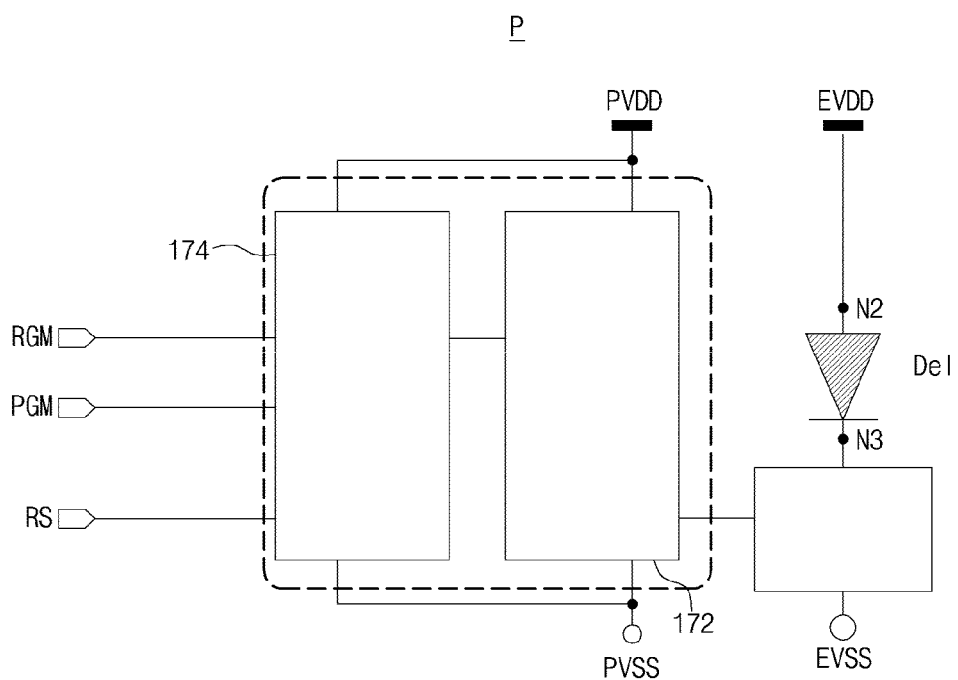
FIG. 32 is a view showing a pixel of a light emitting diode display device according to a seventeenth embodiment of the present disclosure.

FIGS. 31 and 32 are views showing a pixel of a light emitting diode display device according to sixteenth and seventeenth embodiments, respectively, of the present disclosure. Illustration on a part the same as a part of the first to fifteenth embodiments will be omitted.

In FIG. 31, the pixel P of the light emitting diode display device according to a sixteenth embodiment of the present disclosure includes the level shifter 174, the latch 172, a current source 182 and the light emitting diode Del. The level shifter 174 and the latch 172 constitute the control circuit part supplying the control signal to the current source 182, and the current source 182 and the light emitting diode Del constitute the emission part.

The level shifter 174 receives the image data RGB, the programming signal PGM and the reset signal RS and outputs at least one of the first and second output signals using the pin high level voltage PVDD and the pin low level voltage PVSS. The first and second output signals may be inverted signals to each other.

In another embodiment, the reset signal RS may be omitted.

The latch 172 receives at least one of the first and second output signals and outputs at least one of the third and fourth output signals using the pin high level voltage PVDD and the pin low level voltage PVSS. The third and fourth output signals may be inverted signals to each other.

The current source 182 connected to the anode of the light emitting diode Del receives at least one of the third and fourth output signals, and a constant current flows through the light emitting diode Del due to the current source 182 using at least one of the third and fourth output signals.

For example, the level shifter 174 and the latch 172 may include a plurality of transistors, and the current source 182 may include a transistor and a capacitor.

Here, the image data RGB inputted to the level shifter 174 has a digital type of a digital voltage level.

In FIG. 32, the pixel P of the light emitting diode display device according to a seventeenth embodiment of the present disclosure includes the level shifter 174, the latch 172, a current source 184 and the light emitting diode Del. The level shifter 174 and the latch 172 constitute the control circuit part supplying the control signal to the current source 184, and the current source 184 and the light emitting diode Del constitute the emission part.

The level shifter 174 receives the image data RGB, the programming signal PGM and the reset signal RS and outputs at least one of the first and second output signals using the pin high level voltage PVDD and the pin low level voltage PVSS. The first and second output signals may be inverted signals to each other.

In another embodiment, the reset signal RS may be omitted.

The latch 172 receives at least one of the first and second output signals and outputs at least one of the third and fourth output signals using the pin high level voltage PVDD and the pin low level voltage PVSS. The third and fourth output signals may be inverted signals to each other.

The current source 184 connected to the cathode of the light emitting diode Del receives at least one of the third and fourth output signals, and a constant current flows through the light emitting diode Del due to the current source 184 using at least one of the third and fourth output signals.

For example, the level shifter 174 and the latch 172 may include a plurality of transistors, and the current source 184 may include a transistor and a capacitor.

Here, the image data RGB inputted to the level shifter 174 has a digital type of a digital voltage level.

In the pixel P of the light emitting diode display device according to sixteenth and seventh embodiments of the present disclosure, the level shifter 174 outputs at least one of the first and second output signals using the image data RGB, the programming signal PGM and the reset signal RS, and the latch 172 applies at least one of the third and fourth output signals necessary for an emission to the current source 182 and 184. As a result, a constant current may flow through the light emitting diode Del regardless of a change of the emission high level voltage EVDD and the emission low level voltage EVSS.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode display device comprising:
a display panel having a plurality of pixels;

a light emitting diode in each of the plurality of pixels;
at least one current source connected between the light emitting diode and an emission high level voltage or between the light emitting diode and an emission low level voltage; and
a control circuit part supplying a control signal to the at least one current source;
wherein the at least one current source comprises:
a first transistor connected between the light emitting diode and the emission high level voltage and having one of a negative type and a positive type; and
a second transistor connected between the light emitting diode and an emission low level voltage and having another of the negative type and the positive type,
wherein the control circuit part comprises:
a latch connected between a digital high level voltage and a digital low level voltage and generating first and second output signals using an image data and programming signal; and
a level shifter connected between a pin high level voltage and a pin low level voltage and generating third and fourth output signals switching the first and second transistors, respectively, using the first and second output signals, and
wherein the latch comprises;
a first digital transistor of a positive type switching a transmission of the first output signal according to the programming signal;
a second digital transistor of a negative transmission of the image data according to the programming signal,
a fourth digital transistor of a positive type switching a transmission of the digital high level voltage according to the first output signal or the digital low level voltage;
a fifth digital transistor of a negative type switching a transmission of the digital low level voltage according to the first output signal or the digital low level voltage;
a sixth digital transistor of a positive type switching a transmission of the digital high level voltage according to the second output signal; and
a seventh digital transistor of a negative type switching a transmission of the digital low level voltage according to the second output signal, and
wherein the level shifter comprises:
an eighth digital transistor of a positive type switching a transmission of the pin high level voltage according to the third output signal,
a ninth digital transistor of a negative type switching a transmission of the pin low level voltage according to the first output signal;
a tenth digital transistor of a positive type switching a transmission of the pin high level voltage according to the fourth output signal; and
an eleventh digital transistor of a negative type switching a transmission of the pin low level voltage according to the fourth output signal.

2. A light emitting diode display device comprising:
a display panel having a plurality of pixels;
a light emitting diode in each of the plurality of pixels;
at least one current source connected between the light emitting diode and an emission high level voltage or between the light emitting diode and an emission low level voltage; and
a control circuit part supplying a control signal to the at least one current source,
wherein the at least current source comprises:
a first transistor connected between the light emitting diode and the emission high level voltage and having one of a negative type and a positive type; and
a second transistor connected between the light emitting diode and an emission low level voltage and having another of the negative type and the positive type,
wherein the control circuit part includes an integrated level shifter connected between a pin high level voltage and a pin low level voltage and generating first and second output signals switching the first and second transistors, respectively, using an image data, a programming signal and an emission signal, and
wherein the integrated level shifter comprises:
a first digital transistor of a negative type switching a transmission of the first output signal according to the emission signal;
a second digital transistor of a positive type switching a transmission of the first output signal according to the programming signal;
a third digital transistor of a negative type switching a transmission of the image data according to the programming signal;
a fourth digital transistor of a positive type switching a transmission of the pin high level voltage according to the first output signal or the image data;
a fifth digital transistor of a negative type switching a transmission of the pin low level voltage according to the first output signal or the image data;
a sixth digital transistor of a positive type switching a transmission of the pin high level voltage according to the emission signal;
a seventh digital transistor of a positive type switching a transmission of the pin high level voltage according to the second output signal; and
an eighth digital transistor of a negative type switching a transmission of the pin low level voltage according to the second output signal.

3. A light emitting diode display device comprising:
a display panel a plurality of pixels,
a light emitting diode in each of plurality of pixels;
at least one current source connected between the light emitting diode and an emission high level voltage or between the light emitting diode and an emission low level voltage:
a control circuit part supplying a control signal to the at least one current source; and
a third transistor connected between an anode and a cathode of the light emitting diode,
wherein the at least one current source comprises:
a first transistor connected between the light emitting diode and the emission high level voltage and having one of a negative type and a positive type; and
a second transistor connected between the light emitting diode and an emission low level voltage and having another of the negative type and the positive type, and
wherein the first and third transistors have a negative type, and the second transistor has a positive type.

4. The light emitting diode display device of claim 3, further comprising:
a fourth transistor of a negative type switching a connection between a first data signal and a gate of the first transistor according to a first programming signal;
a fifth transistor of a negative type switching a connection between a second data signal and a source of the first transistor according to a second programming signal; and a first capacitor connected between a gate and a source of the first transistor.

5. The light emitting diode display device of claim 3, further comprising:
a fourth transistor of a negative type switching a connection between a first data signal and a gate of the first transistor according to a programming signal;
a fifth transistor of a negative type switching a connection between a second data signal and a source of the first transistor according to the programming signal; and
a first capacitor connected between a gate and a source of the first transistor.

6. The light emitting diode display device of claim 3, further comprising:
a fourth transistor of a negative type switching a connection between a data signal and a gate of the first transistor according to a programming signal;
a fifth transistor of a negative type switching a connection between a reference signal and a source of the first transistor according to a sense signal; and
a first capacitor connected between a gate of the first transistor and a drain of the fifth transistor.

7. A light emitting diode display device comprising:
a display panel of pixels;
a light emitting diode in each of the plurality of pixels;
at least one current source connected between the light emitting diode and an emission high level voltage or between the light emitting diode and an emission low level voltage; and
a control circuit part supplying a control signal to the at least one current source,
wherein the at least one current source comprises:
a first transistor connected between the light emitting diode and the emmission high level voltage and having one of a negative type and a positive type; and
a second transistor connected between the light emitting diode and an emission low level voltage and having another of the negative type and the positive type,
wherein the control circuit part comprises:
a level shifter connected between a pin high level voltage and a pin low level voltage and generating first and second output signals using first and second image data, a programming signal and an enable signal; and
a latch connected between the pin high level voltage and the pin low level voltage and generating third and fourth output signals switching the first and second transistors, respectively, using the first and second output signals, and
wherein the level shifter comprises:
a first digital transistor switching a connection between the pin high level voltage and a drain of a third digital transistor according to the first output signal;
a second digital transistor switching a connection between the pin high level voltage and a drain of a fourth digital transistor according to the second output signal;
the third digital transistor switching a connection between a drain of the first digital transistor and a drain of a ninth digital transistor according to the first output signal;
the fourth digital transistor switching a connection between a drain of the second digital transistor and a drain of the ninth digital transistor according to the second output signal;
a fifth digital transistor switching a connection between a drain of the first digital transistor and a drain of the ninth digital transistor according to a voltage of a first electrode of a first capacitor;
a sixth digital transistor switching a connection between a drain of the second digital transistor and a drain of the ninth digital transistor according to a voltage of a first electrode of a second capacitor;
a seventh digital transistor switching a connection between the first image data and a gate of the fifth digital transistor according to the programming signal;
an eighth digital transistor switching a connection between the second image data and a gate of the sixth digital transistor according to the programming signal; and
the ninth digital transistor switching a connection between sources of the third to sixth digital transistors and the pin low level voltage according to the enable signal;
the first capacitor connected between a source of the seventh digital transistor and the pin low level voltage; and
the second capacitor connected between a source of the eighth digital transistor and the pin low level voltage.

8. A light emitting diode display device comprising of:
a display panel a plurality of pixels,
a light emitting diode in each of the plurality of pixels;
at least one current source connected light emitting diode and an emission high level voltage or between the light emitting diode and an emission low level voltage; and
a control circuit part supply a control signal to the at least one current source,
wherein the at least one current source comprises:
a first transistor connected the light emitting diode and the emission high level voltage and having one of a negative type and positive type; and
a second transistor connected between the light emitting diode and an emission low level voltage and having another of the negative type and positive type,
wherein the control circuit part comprises:
a level shifter connected between a pin high level voltage and a pin low level voltage and generating an output signal using an image data, a programming signal and a precharge signal; and
a latch connected between the pin high level voltage and the pin low level voltage and generating third and fourth output signals switching the first and second transistors, respectively, using the output signal, and
wherein the level shifter comprises:
a first digital transistor switching a connection between the pin high level voltage and a drain of a third digital transistor according to the precharge signal;
a second digital transistor switching a connection between the pin high level voltage and a drain of a fourth digital transistor according to a voltage of a first electrode of a second capacitor;
the third digital transistor switching a connection between a drain of the first digital transistor and a drain of a sixth digital transistor according to the precharge signal;
the fourth digital transistor switching a connection between a drain of the second digital transistor and the pin low level voltage according to a voltage of a first electrode of the second capacitor;
a fifth digital transistor switching a connection between the image data and a gate of a sixth digital transistor according to a voltage of a first electrode of a first capacitor;
the sixth digital transistor switching a connection between a source of the third digital transistor and the pin low level voltage according to a voltage of a first electrode of a first capacitor;

the first capacitor connected between a source of the fifth digital transistor and the pin low level voltage; and the second capacitor connected between a source of the second digital transistor and the pin low level voltage.

9. A light emitting diode display device comprising:
display panel having a plurality of pixels;
a light emitting diode in each of the plurality of pixels;
at least one current source connected between emitting diode and an emission high level voltage or between the light emitting diode and an emission low level voltage;
a control circuit part supplying a control signal to the at least one current source; and
a third transistor connected between an anode of the light emitting diode and a test voltage,
wherein the at least one current source includes a first transistor connected between the light emitting diode and an emission high level voltage and having one of a negative type and a positive type, and
wherein a cathode of the light emitting diode is connected to an emission low level voltage.

10. The light emitting diode display device of claim 9, wherein the control circuit part comprises:
a latch connected between a digital high level voltage and a digital low level voltage and generating first and second output signals using an image data and a programming signal; and
a level shifter connected between a pin high level voltage and a pin low level voltage and generating a third output signal switching the first transistor using the first and second output signals.

11. The light emitting diode display device of claim 9, wherein the control circuit part includes an integrated level shifter connected between a pin high level voltage and a pin low level voltage and generating a first output signal switching the first transistor using an image data, a programming signal and an emission signal.

12. The light emitting diode display device of claim 9, further comprising:
a fourth transistor of a negative type switching a connection between a first data signal and a gate of the first transistor according to a first programming signal;
a fifth transistor of a negative type switching a connection between a second data signal and a source of the first transistor according to a second programming signal; and
a first capacitor connected between a gate and a source of the first transistor.

13. The light emitting diode display device of claim 9, further comprising:
a fourth transistor of a negative type switching a connection between a first data signal and a gate of the first transistor according to a programming signal;
a fifth transistor of a negative type switching a connection between a second data signal and a source of the first transistor according to the programming signal; and
a first capacitor connected between a gate and a source of the first transistor.

14. The light emitting diode display device of claim 9, further comprising:
a fourth transistor of a negative type switching a connection between a data signal and a gate of the first transistor according to a programming signal;
a fifth transistor of a negative type switching a connection between a reference signal and a source of the first transistor according to a sense signal; and
a first capacitor connected between a gate of the first transistor and a drain of the fifth transistor.

15. The light emitting diode display device of claim 9, further comprising:
a fourth transistor of a negative type switching a connection between the first output signal and a source of the first transistor according to a reference signal;
a fifth transistor of a negative type switching a connection between the second output signal and a gate of the first transistor according to the reference signal;
a sixth transistor of a positive type switching a connection between the emission high level voltage and a source of the first transistor according to a first emission signal;
a seventh transistor of a negative type switching a connection between a drain of the first transistor and an anode of the light emitting diode according to a second emission signal; and
a first capacitor connected between gate and source of the first transistor,
wherein the control circuit part includes a latch connected between a digital high level voltage and a digital low level voltage and generating first and second output signals using an image data and a programming signal.

16. The light emitting diode display device of claim 9, further comprising:
a fourth transistor of a negative type switching a connection between the first output signal and a gate of the first transistor according to a reference signal;
a fifth transistor of a negative type switching a connection between the second output signal and a source of the first transistor according to the reference signal;
a sixth transistor of a positive type switching a connection between the emission high level voltage and a drain of the first transistor according to a first emission signal;
a seventh transistor of a negative type switching a connection between a source of the first transistor and an anode of the light emitting diode according to a second emission signal; and
a first capacitor connected between gate and source of the first transistor,
wherein the control circuit part includes a latch connected between a digital high level voltage and a digital low level voltage and generating first and second output signals using an image data and a programming signal.

* * * * *